(12) United States Patent
Han et al.

(10) Patent No.: US 12,514,060 B2
(45) Date of Patent: Dec. 30, 2025

(54) METHOD OF MANUFACTURING DISPLAY DEVICE

(71) Applicant: Samsung Display Co., Ltd., Yongin-si (KR)

(72) Inventors: Kang Soo Han, Seoul (KR); Kanguk Kim, Hwaseong-si (KR); Dongjun Lee, Yongin-si (KR); Songee Lee, Seoul (KR); Sangyeon Hwang, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 714 days.

(21) Appl. No.: 17/726,978

(22) Filed: Apr. 22, 2022

(65) Prior Publication Data
US 2023/0019886 A1    Jan. 19, 2023

(30) Foreign Application Priority Data

Jul. 12, 2021  (KR) .................. 10-2021-0091252

(51) Int. Cl.
*H10K 59/12* (2023.01)
*H10K 71/13* (2023.01)
*H10K 50/86* (2023.01)

(52) U.S. Cl.
CPC .......... *H10K 59/12* (2023.02); *H10K 71/135* (2023.02); *H10K 50/865* (2023.02)

(58) Field of Classification Search
None
See application file for complete search history.

(56) References Cited

U.S. PATENT DOCUMENTS

| | | | |
|---|---|---|---|
| 7,795,800 B2 | 9/2010 | Lee et al. | |
| 9,579,905 B2 | 2/2017 | Ko et al. | |
| 9,919,539 B2 | 3/2018 | Sugai et al. | |
| 2007/0247480 A1 | 10/2007 | Kwon et al. | |
| 2016/0159113 A1* | 6/2016 | Ko ........................ | B05D 5/00 347/102 |
| 2022/0258465 A1* | 8/2022 | Han ..................... | B41J 2/145 |

FOREIGN PATENT DOCUMENTS

| | | |
|---|---|---|
| JP | 2016120603 A | 7/2016 |
| JP | 2016155062 A | 9/2016 |
| KR | 1020050068819 A | 7/2005 |
| KR | 1020070104746 A | 10/2007 |
| KR | 1020200084476 A | 7/2020 |

* cited by examiner

*Primary Examiner* — Shamim Ahmed
*Assistant Examiner* — Bradford M Gates
(74) *Attorney, Agent, or Firm* — CANTOR COLBURN LLP

(57) ABSTRACT

A method of manufacturing a display device, which is provided using an inkjet apparatus that provides a liquid composition including a scatterer, includes performing j scanning stages to provide a first composition to i unit display areas among n unit display areas (j is a natural number equal to or greater than 2), and performing a first compensation-scanning stage to provide the first composition to first to (i−1)-th unit display areas among the n unit display areas. The i unit areas of the first head unit provide the first composition to the first unit display area to an i-th unit display area among the n unit display areas in a first scanning stage among the j scanning stages. The first head unit is shifted in the second direction by one unit display area in every scanning stage of the j scanning stages.

20 Claims, 23 Drawing Sheets

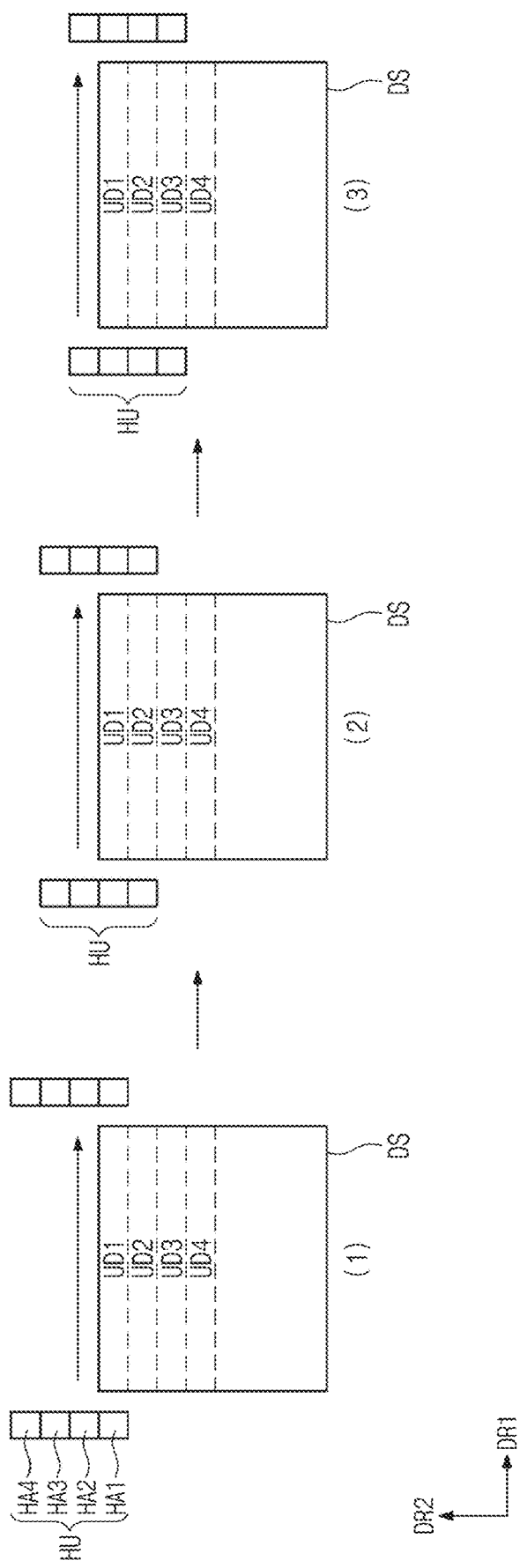

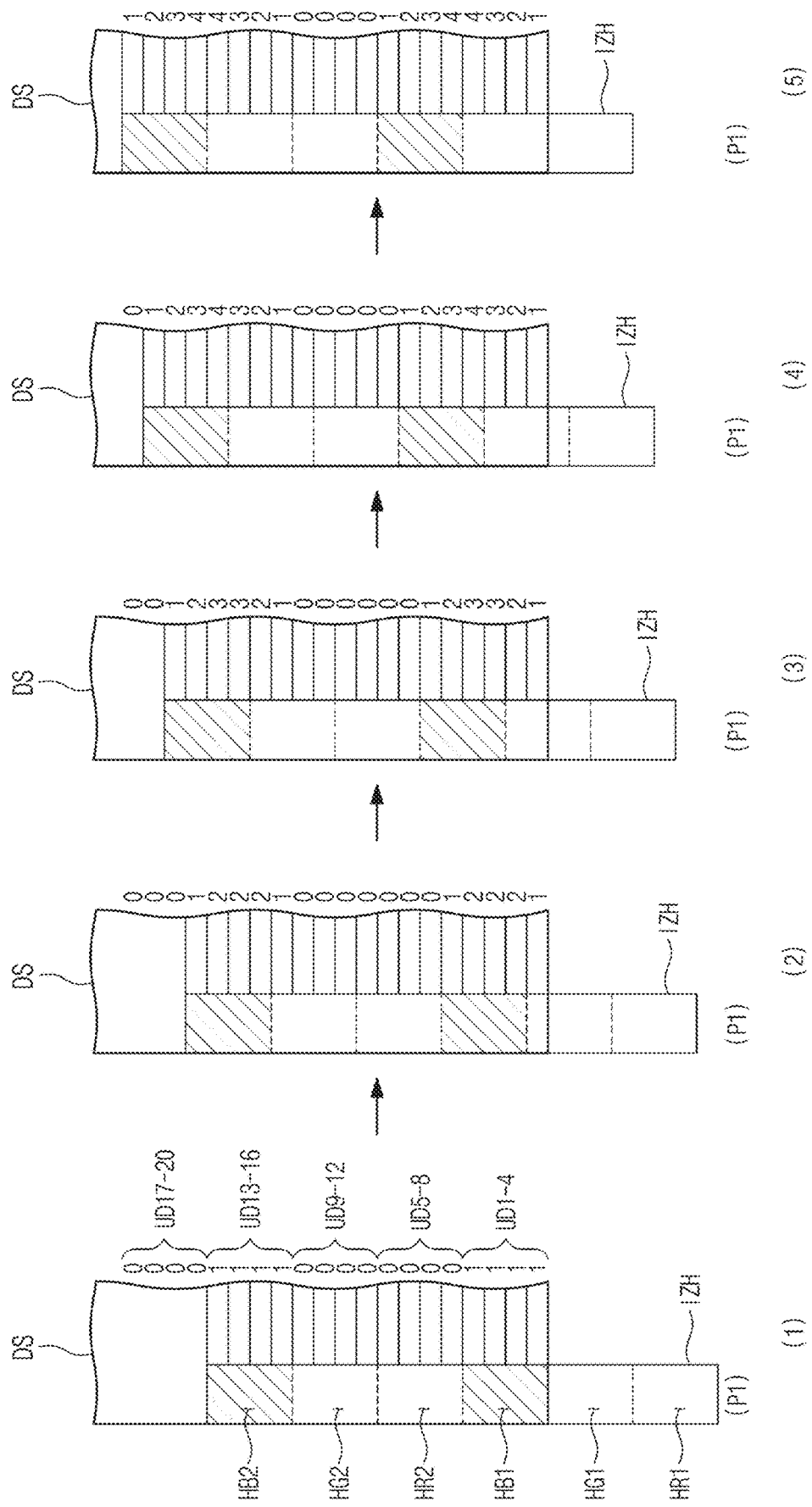

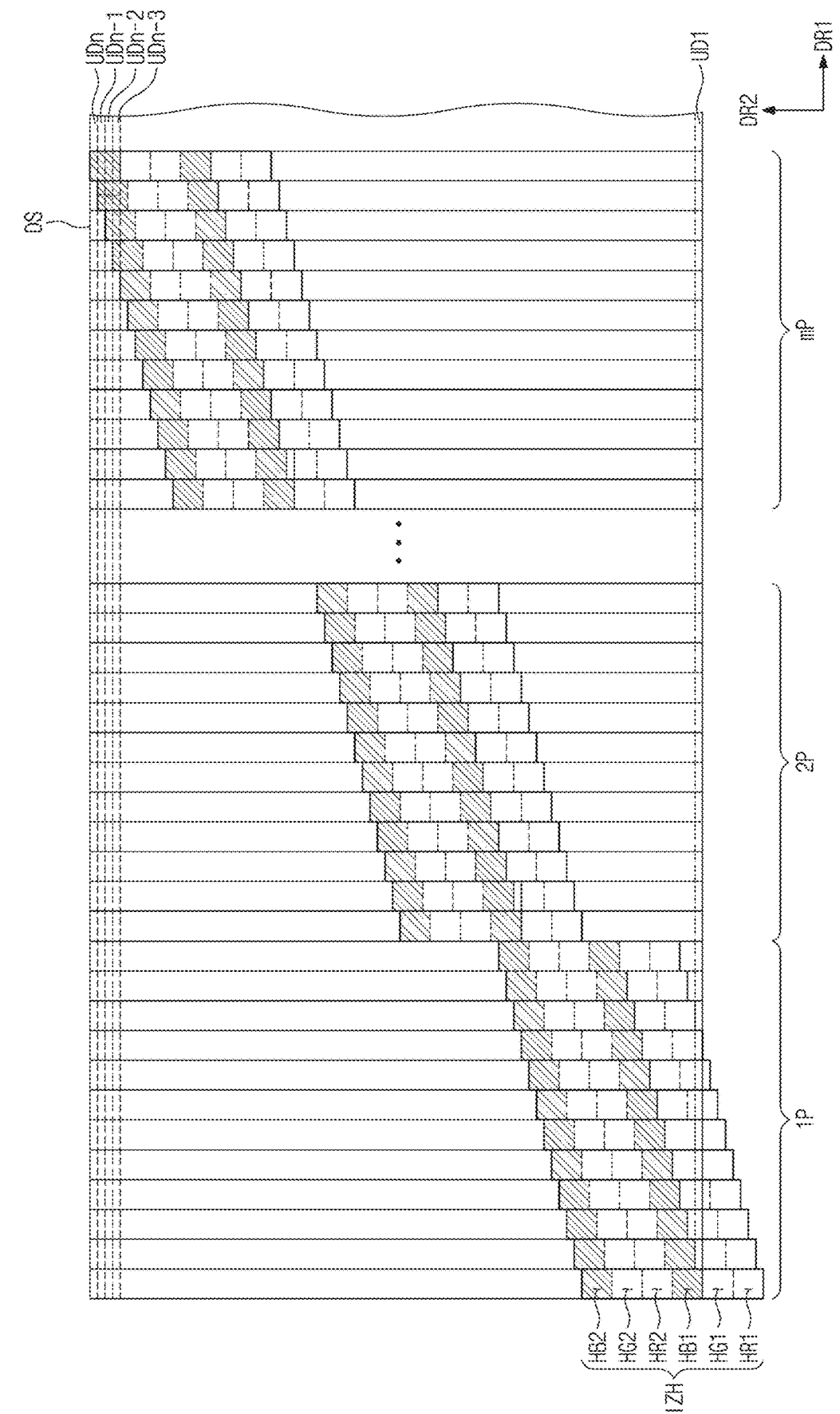

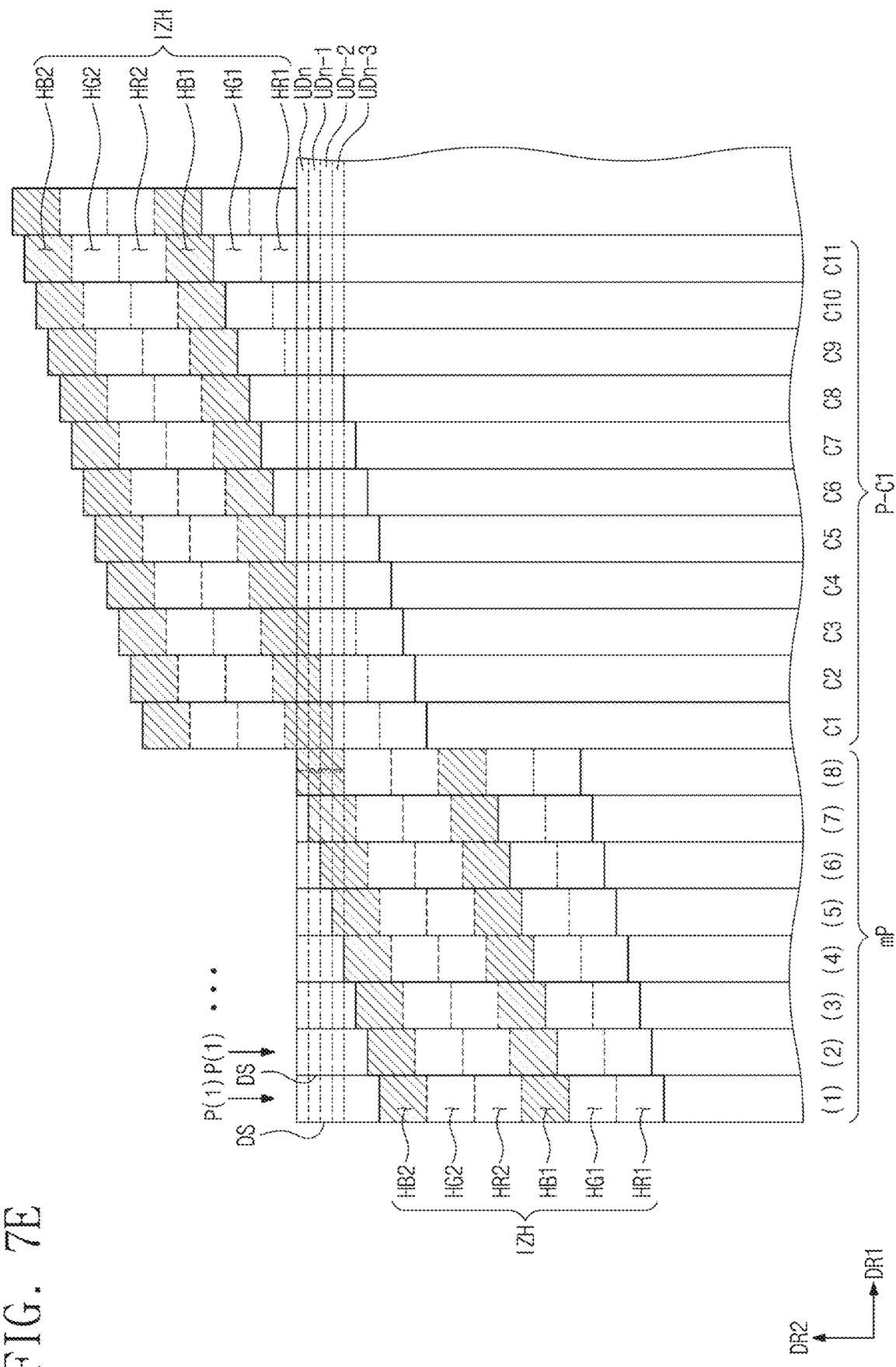

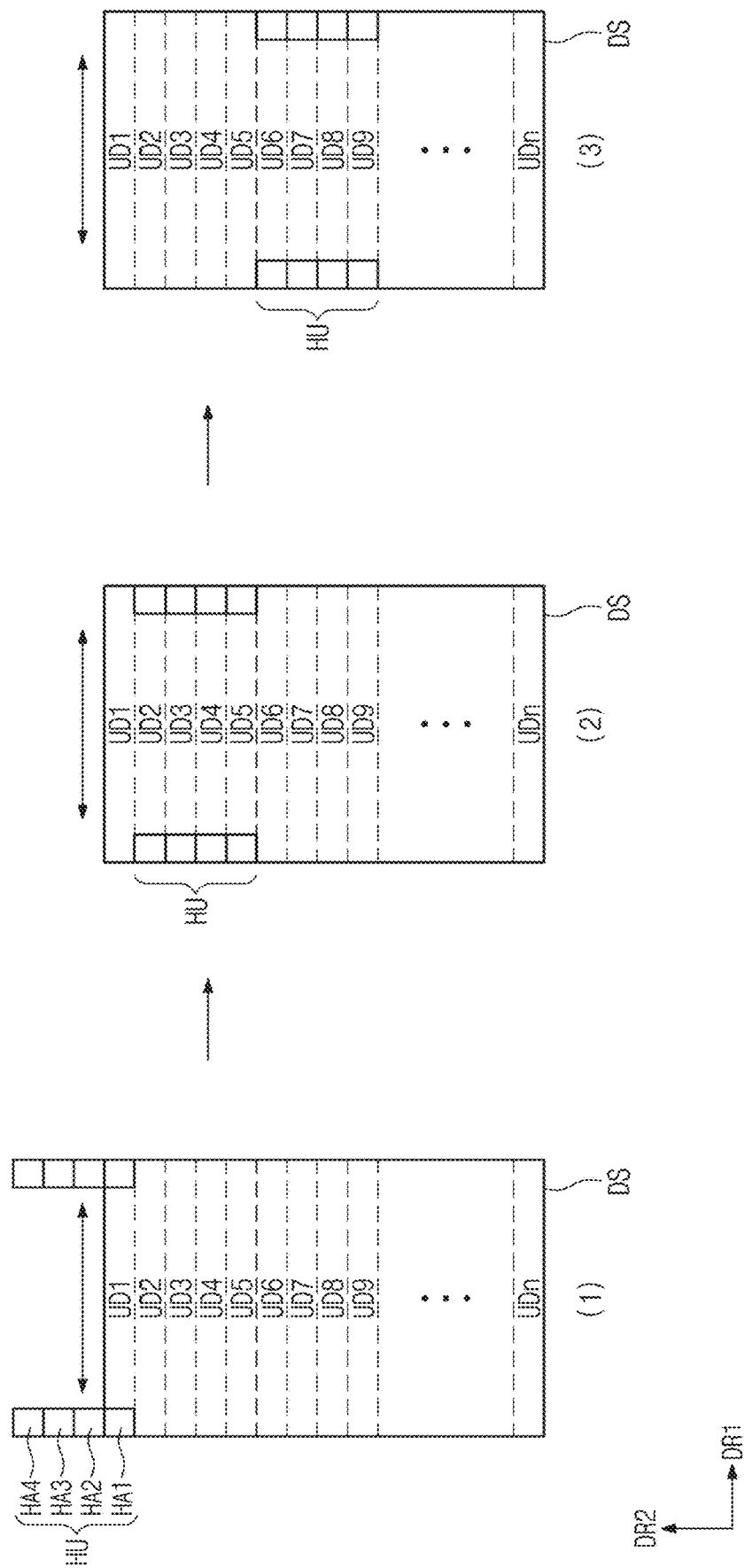

METHOD OF MANUFACTURING DISPLAY DEVICE

This application claims priority to Korean Patent Application No. 10-2021-0091252, filed on Jul. 12, 2021, and all the benefits accruing therefrom under 35 U.S.C. § 119, the content of which in its entirety is herein incorporated by reference.

BACKGROUND

1. Field

The disclosure relates to a method of manufacturing a display device. More particularly, the disclosure relates to a method of manufacturing a display device using an inkjet apparatus.

2. Description of the Related Art

Display devices may be classified into a transmissive display device that selectively transmits a source light generated by a light source and an emissive display device that generates the source light. The display device includes different types of light control patterns depending on pixels to generate color images. The light control patterns may transmit only a partial wavelength range of the source light or convert a color of the source light. Some light control patterns may change characteristics of the source light without changing the color of the source light.

SUMMARY

The disclosure provides a method of manufacturing a display device, which is capable of forming uniform light control patterns.

Embodiments of the invention provide a method of manufacturing a display device using an inkjet apparatus which provides a liquid composition including a scatterer. In such embodiments, the display device includes a display substrate including n unit display areas extending in a first direction and arranged in a second direction crossing the first direction, where n is a natural number equal to or greater than 12, and the inkjet apparatus includes a first head unit including i unit areas each of which corresponds to one unit display area, where i is a natural number equal to or greater than 2).

In such embodiments, the manufacturing method includes performing j scanning stages to provide a first composition to i unit display areas among the n unit display areas, where j is a natural number equal to or greater than 2, and performing a first compensation-scanning stage to provide the first composition to first to (i−1)-th unit display areas among the n unit display areas. In such embodiments, the i unit areas of the first head unit provide the first composition to the first unit display area to an i-th unit display area among the n unit display areas in a first scanning stage among the j scanning stages, and the first head unit is shifted in the second direction by one unit display area in every scanning stage of the j scanning stages.

In an embodiment, the first compensation-scanning stage may include a plurality of compensation-scanning stages, and the compensation-scanning stages of the first compensation-scanning stage may include a beginning compensation-scanning stage in which (i−1) unit areas among the i unit areas of the first head unit provide the first composition to the first to (i−1)-th unit display areas among the n unit display areas.

In an embodiment, the first head unit may be shifted in a direction opposite to the second direction by the one unit display area in every compensation-scanning stage of the compensation-scanning stages.

In an embodiment, the unit areas, which do not overlap the first to (i−1)-th unit display areas, among the i unit areas of the first head unit do not provide the first composition in the first compensation-scanning stage.

In an embodiment, the method may further include performing a second compensation-scanning stage to provide the first composition to (n−(i−2))-th to n-th unit display areas among the n unit display areas.

In an embodiment, the second compensation-scanning stage may be consecutively performed following a j-th scanning stage among the j scanning stages.

In an embodiment, the second compensation-scanning stage includes a plurality of compensation-scanning stages, and the compensation-scanning stages of the second compensation-scanning stage include a beginning compensation-scanning stage in which (i−1) unit areas among the i unit areas of the first head unit provide the first composition to the (n−(i−2))th to n-th unit display areas among the n unit display areas.

In an embodiment, the first head unit may be shifted in the second direction by the one unit display area in every compensation-scanning stage of the compensation-scanning stages.

In an embodiment, the inkjet apparatus may further include a second head unit including i unit areas, and the second head unit provides a second composition different from the first composition to the i unit display areas.

In an embodiment, the method may further include allowing the first head unit to provide the first composition to an outside of the display substrate before the j scanning stages.

In an embodiment, the inkjet apparatus may further include a tank which stores the first composition, and the first composition stored in the tank may be circulated through an external path by a pump.

In an embodiment, the inkjet apparatus may further include a tank which stores the first composition, and the first composition stored in the tank may be circulated inside the tank by a stirrer.

Embodiments of the invention provide a method of manufacturing a display device using an inkjet apparatus which provides a liquid composition including a resin composition and particles dispersed in the resin composition. In such embodiments, the display device includes a display substrate including n unit display areas extending in a first direction and arranged in a second direction crossing the first direction, where n is a natural number equal to or greater than 12, and the inkjet apparatus includes a first head unit and a second head unit spaced apart from the first head unit in the second direction. In such embodiments, each of the first and second head units includes i unit areas each of which corresponds to one unit display area, where i is a natural number equal to or greater than 2. In such embodiments, the manufacturing method includes performing j scanning stages to provide a first composition to i unit display areas among the n unit display areas, where j is a natural number equal to or greater than 2, and performing a first compensation-scanning stage to provide the first composition to first to (i−1)-th unit display areas among the n unit display areas. In such embodiments, the i unit areas of the first head unit provide the first composition to the first unit display area to an i-th unit display area among the n unit display areas in a first scanning stage among the j scanning stages. In such embodiments, the first head unit and the second head unit are shifted in the second direction by one unit display area in every scanning stage of the j scanning stages, and the first composition is provided using the first head unit or the second head unit in the first compensation-scanning stage.

In an embodiment, the inkjet apparatus may further include a third head unit disposed between the first head unit and the second head unit, the third head unit may include i unit areas, and the third head unit may provide a second composition different from the first composition to the i unit display areas.

In an embodiment, the first head unit and the second head unit may be spaced apart from each other by k unit display areas in the second direction, where k is a natural number equal to or greater than 2, and the first head unit and the second head unit may be shifted in the second direction by i+k+1 unit display areas after the first head unit and the second head unit are scanned by j times.

In an embodiment, the j may be equal to 3i, and k may be equal to 2i.

In an embodiment, the method may further include performing a second compensation-scanning stage to provide the first composition to (n−(i−2))th to n-th unit display areas among the n unit display areas. In such an embodiment, the first composition may be provided using the first head unit or the second head unit in the second compensation-scanning stage.

In an embodiment, the first compensation-scanning stage may be performed using the first or second head unit which is used in the second compensation-scanning stage.

In an embodiment, the second compensation-scanning stage may include a plurality of compensation-scanning stages, and the compensation-scanning stages of the second compensation-scanning stage may include a beginning compensation-scanning stage in which i−1 unit areas among the i unit areas of the first head unit or the second head unit provide the first composition to the (n−(i−2))-th to n-th unit display areas among the n unit display areas.

In an embodiment, the first head unit or the second head unit may be shifted in the second direction by the one unit display area in every compensation-scanning stage of the compensation-scanning stages.

According to embodiments of the invention, as described above, the liquid composition provided in an initial scanning stage of the inkjet process is distributed into a plurality of unit display areas. Therefore, the liquid composition including the scatterer with relatively high weight ratio is effectively prevented from being intensively provided to a specific unit display area. Accordingly, a difference in weight ratio of the scatterer in each unit display area of the display device is reduced.

BRIEF DESCRIPTION OF THE DRAWINGS

The above and other features of the disclosure will become readily apparent by reference to the following detailed description when considered in conjunction with the accompanying drawings, in which:

FIG. 5 is a view showing an inkjet process according to a comparative example;

FIGS. 7A to 7F are plan views showing an inkjet process according to an embodiment of the disclosure;

FIG. 9 is a plan view showing an inkjet process according to an embodiment of the disclosure.

DETAILED DESCRIPTION

Figure 1:
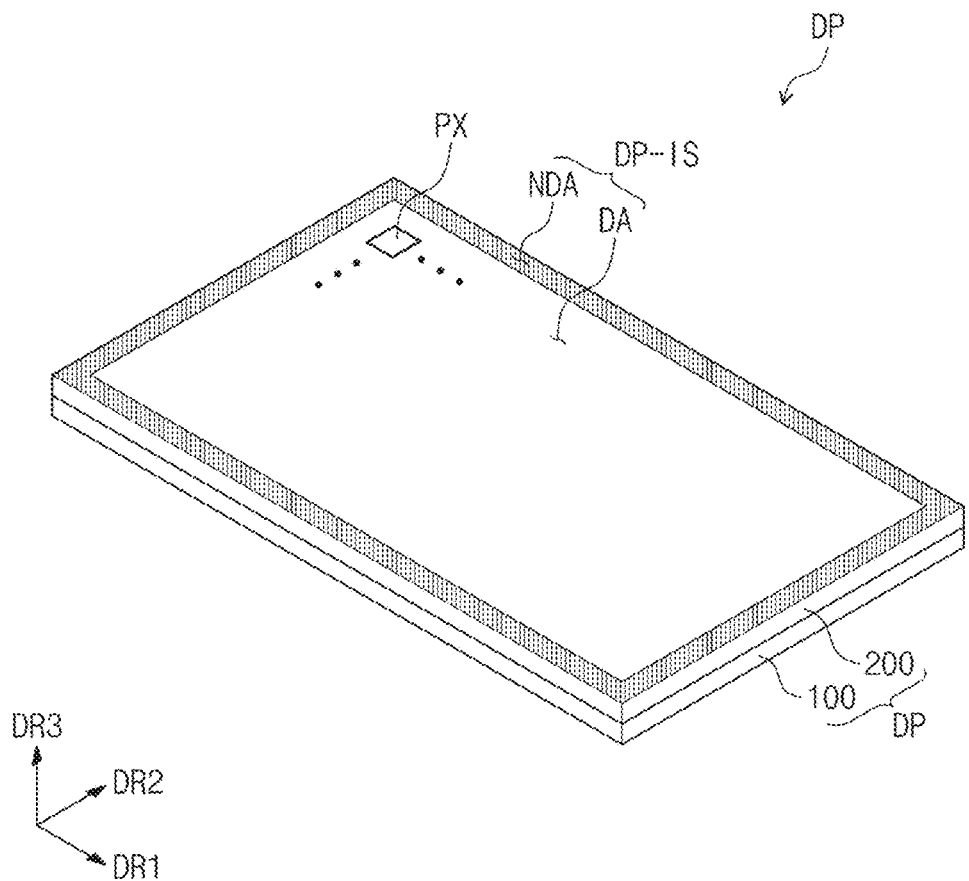
FIG. 1 is a perspective view showing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on" another element, there are no intervening elements present.

Like numerals refer to like elements throughout. In the drawings, the thickness, ratio, and dimension of components are exaggerated for effective description of the technical content. "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
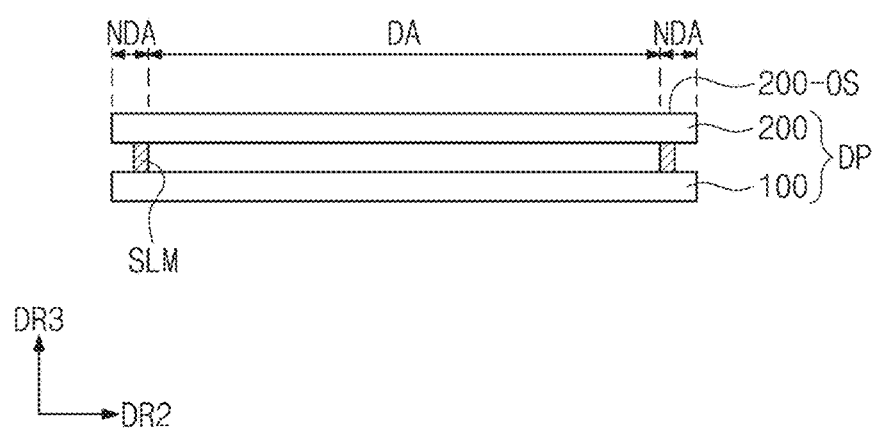
FIG. 2 is a cross-sectional view showing a display device according to an embodiment of the disclosure.

FIG. 1 is a perspective view showing a display device DP according to an embodiment of the disclosure. FIG. 2 is a cross-sectional view showing the display device DP according to an embodiment of the disclosure.

In an embodiment, the display device DP may be one of a liquid crystal display device, an electrophoretic display device, a microelectromechanical system ("MEMS") display device, an electrowetting display device, a quantum dot light emitting display device, and an organic light emitting display device. The display device DP should not be particularly limited as long as the display device DP may be manufactured using an inkjet process as an essential process in manufacturing the display device DP.

Referring to FIGS. 1 and 2, an embodiment of the display device DP may include a first display substrate 100 (or a lower display substrate) and a second display substrate 200 (or an upper display substrate) facing the first display substrate 100 and spaced apart from the first display substrate 100. A predetermined cell gap may be defined between the first display substrate 100 and the second display substrate 200. The cell gap may be maintained by a sealant SLM for coupling the first display substrate 100 and the second display substrate 200. An insulating material may be filled in the cell gap.

A grayscale display layer may be disposed between a base substrate of the first display substrate 100 and a base substrate of the second display substrate 200 to generate an image. The grayscale display layer may include a liquid crystal layer, an organic light emitting layer, an inorganic light emitting layer such as a quantum dot light emitting layer, an LED light emitting layer, etc., or an electrophoretic layer depending on the type of the display device DP.

In an embodiment, as shown in FIG. 1, the display device DP may display the image through a display surface DP-IS. An outer surface 200-OS of the second display substrate 200 shown in FIG. 2 may be defined as the display surface DP-IS of FIG. 1. The display surface DP-IS may be substantially parallel to a plane defined by a first directional axis DR1 and a second directional axis DR2. The display device DP may include a display area DA and a non-display area NDA. A pixel PX may be disposed in the display area DA and may not be disposed in the non-display area NDA. The non-display area NDA may be defined along an edge of the display surface DP-IS, however, it should not be limited thereto or thereby. According to an alternative embodiment, the non-display area NDA may be omitted or may be disposed at only one side of the display area DA.

A third directional axis DR3 may indicate a normal line direction of the display surface DP-IS, i.e., a thickness direction of the display device DP. Front (or upper) and rear (or lower) surfaces of each layer or each unit of the display device DP are distinguished from each other by the third directional axis DR3. However, the first, second, and third directional axes DR1, DR2, and DR3 described in the embodiment are merely examples. Hereinafter, first, second, and third directions are defined as directions respectively indicated by the first, second, and third directional axes DR1, DR2, and DR3 and are assigned with the same reference numerals as the first, second, and third directional axes DR1, DR2, and DR3.

Figure 3A:
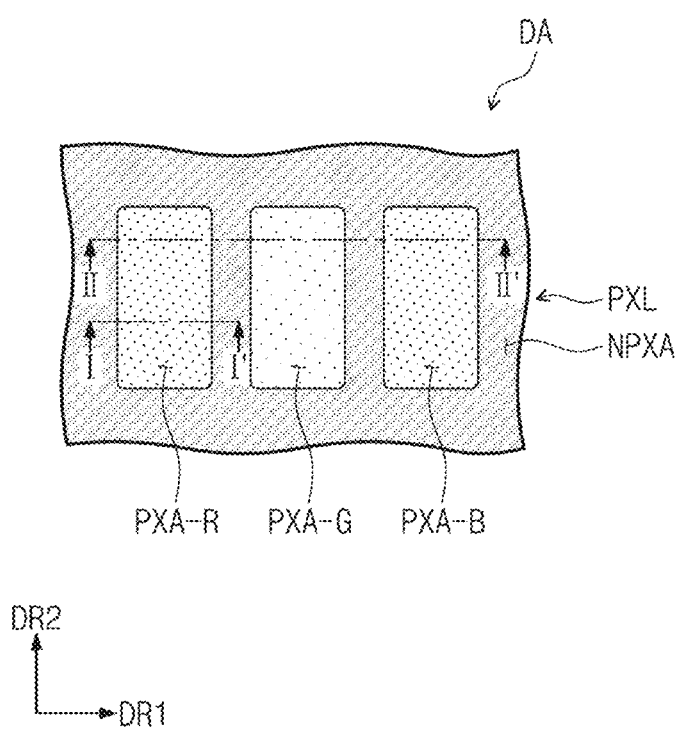
FIG. 3A is a plan view showing a display area of a display device according to an embodiment of the disclosure.
Figure 3B:
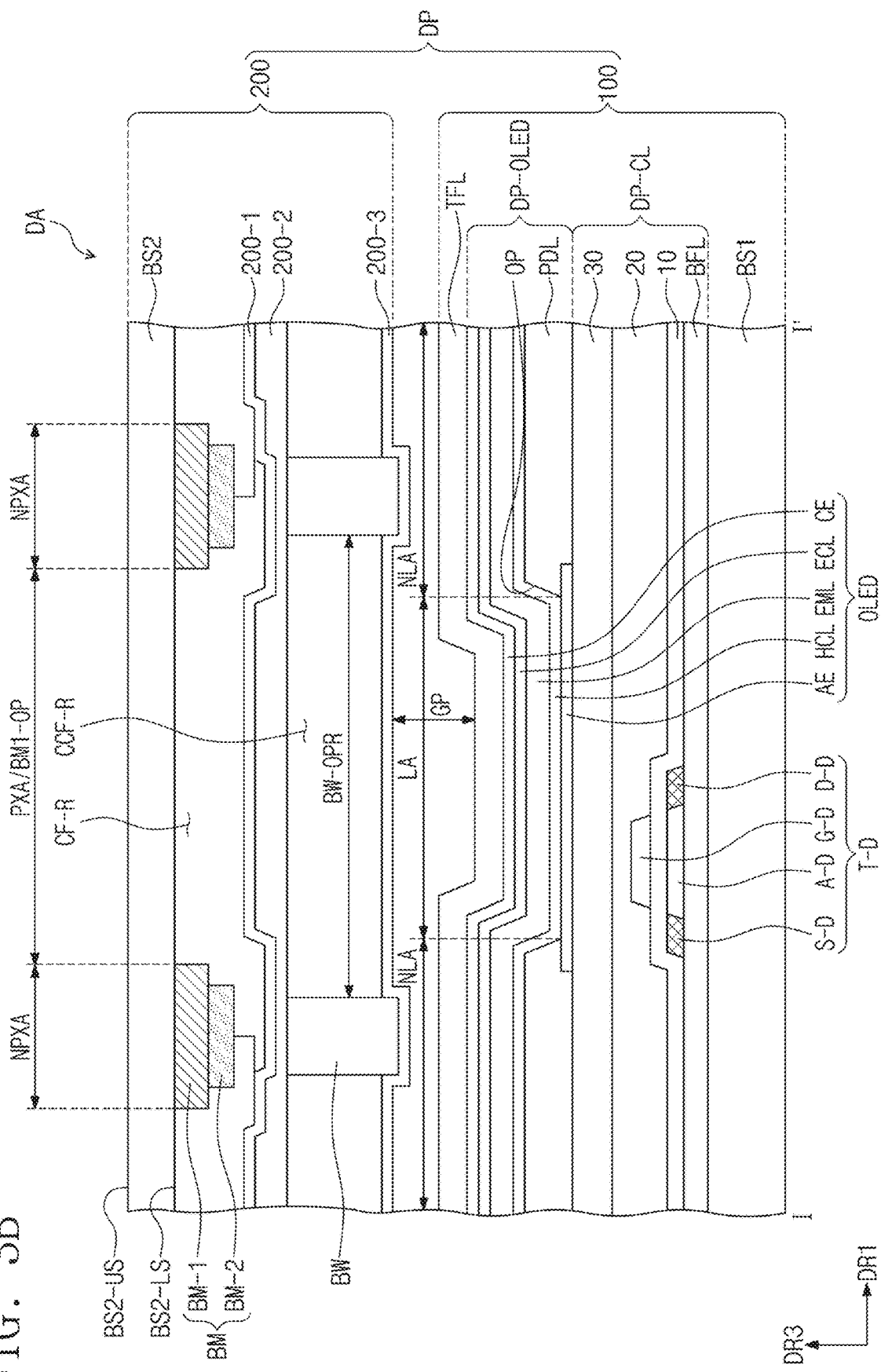
FIG. 3B is a cross-sectional view showing a display device according to an embodiment of the disclosure.
Figure 3C:
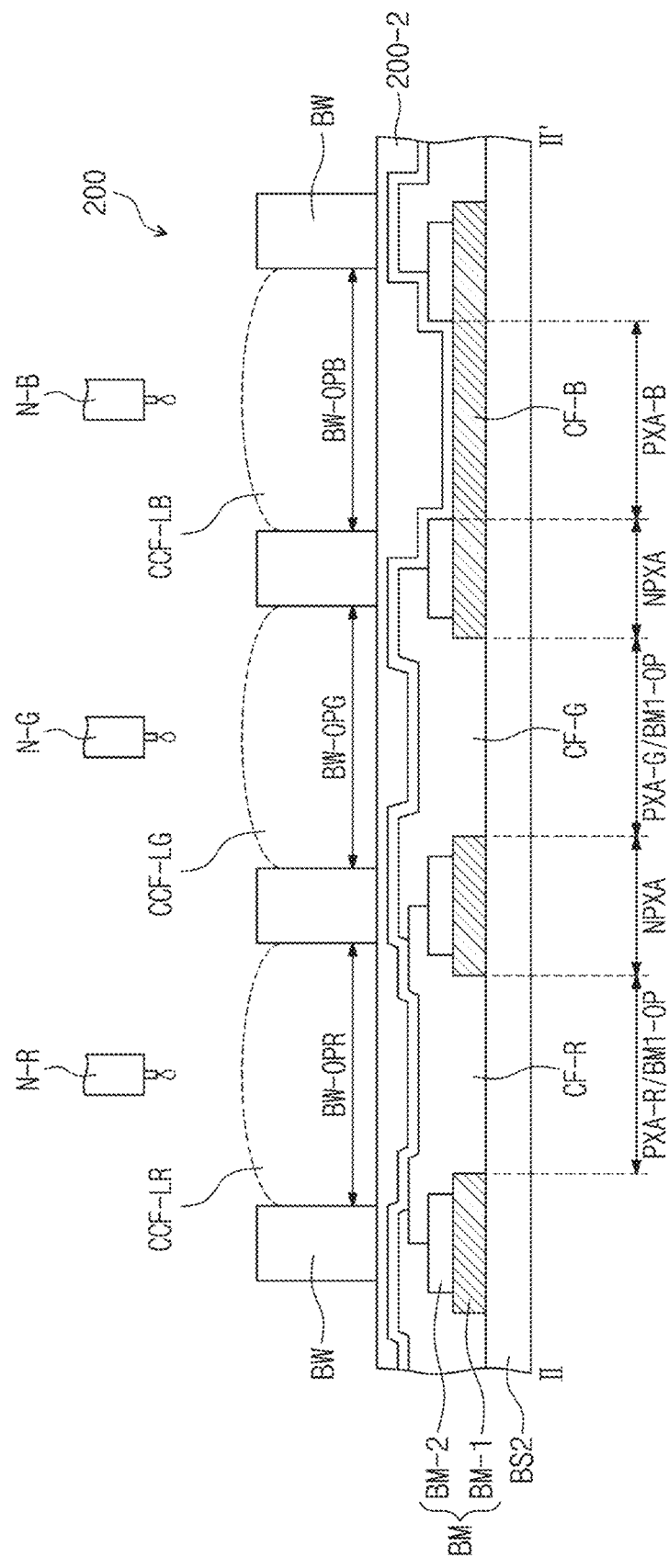
FIG. 3C is a cross-sectional view showing a portion of a manufacturing process of a display device according to an embodiment of the disclosure.
Figure 3D:
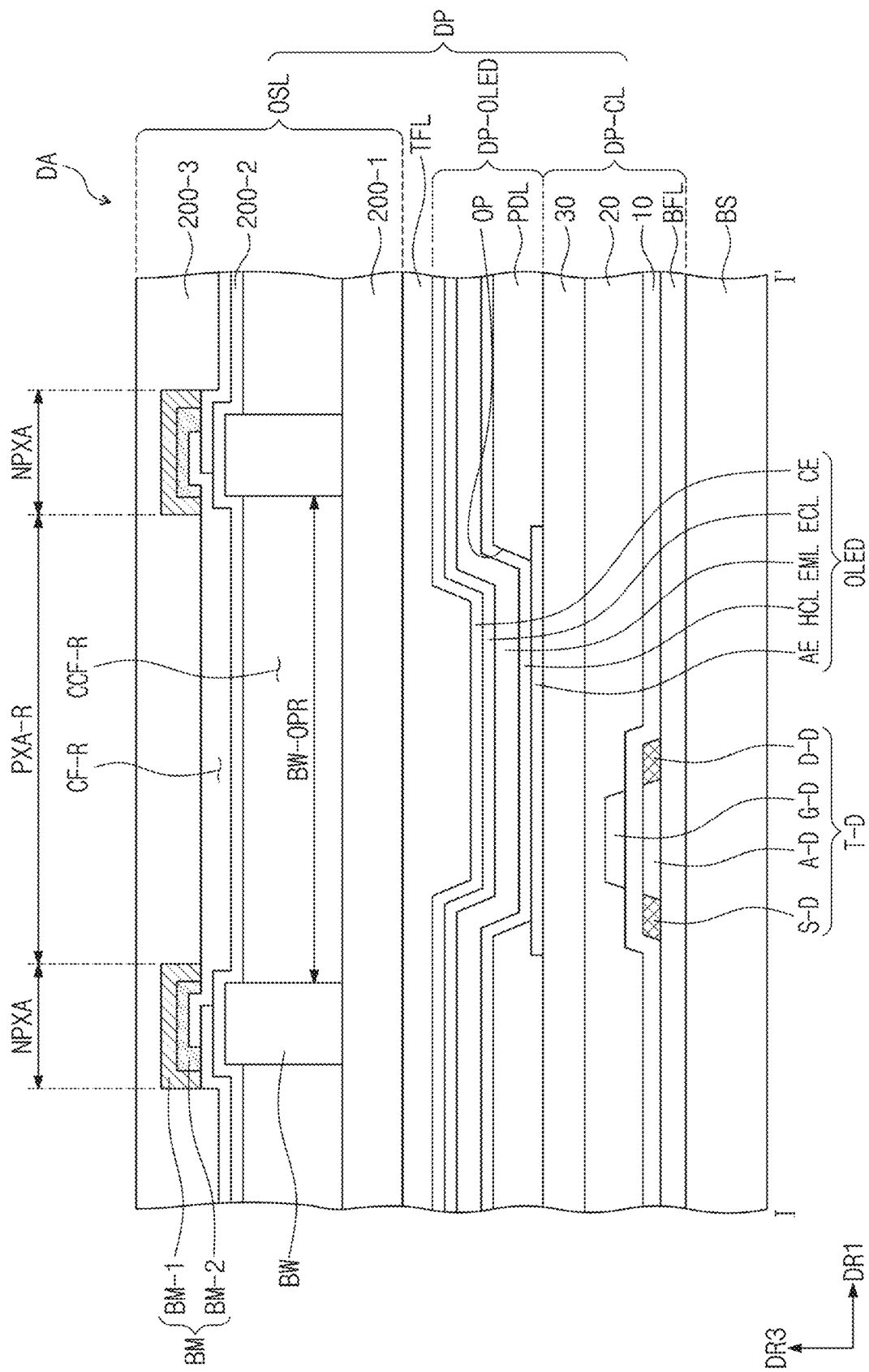
FIG. 3D is a cross-sectional view showing a display device according to an embodiment of the disclosure.
Figure 3E:
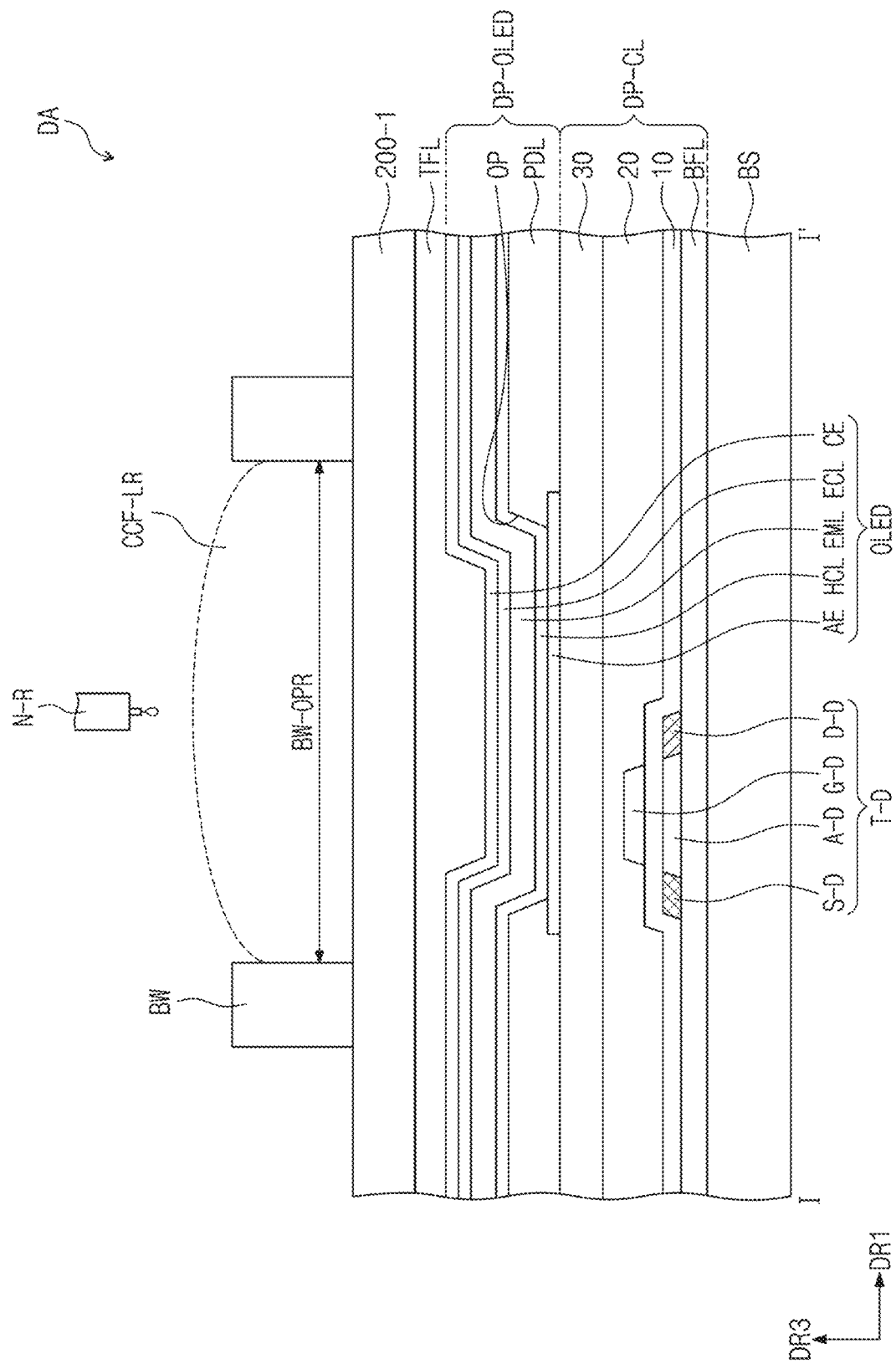
FIG. 3E is a cross-sectional view showing a portion of a manufacturing process of a display device according to an embodiment of the disclosure.

FIG. 3A is a plan view showing the display area DA of the display device DP according to an embodiment of the disclosure. FIG. 3B is a cross-sectional view showing the display device DP according to an embodiment of the disclosure. FIG. 3C is a cross-sectional view showing a portion of a manufacturing process of the display device DP according to an embodiment of the disclosure. FIG. 3D is a cross-sectional view showing a display device DP according to an embodiment of the disclosure. FIG. 3E is a cross-sectional view showing a portion of a manufacturing process of the display device DP according to an embodiment of the disclosure.

FIG. 3A shows a plurality of pixel areas PXA-R, PXA-G, and PXA-B when viewed from in a top plan view of the second display substrate 200 (refer to FIG. 2). FIG. 3A shows a first pixel area PXA-R, a second pixel area PXA-G, and a third pixel area PXA-B, which are arranged in one pixel row PXL. The first pixel area PXA-R, the second pixel area PXA-G, and the third pixel area PXA-B may be areas that provide lights having different colors from each other. The first pixel area PXA-R may provide (or emit) a red light, the second pixel area PXA-G may provide a green light, and the third pixel area PXA-B may provide a blue light.

A peripheral area NPXA may be disposed adjacent to the first, second, and third pixel areas PXA-R, PXA-G, and PXA-B to define a boundary between the first, second, and third pixel areas PXA-R, PXA-G, and PXA-B. The first pixel area PXA-R, the second pixel area PXA-G, and the third pixel area PXA-B may be defined as a group, and such a group may be repeatedly arranged in the pixel row PXL along the first direction DR1. The pixel row PXL shown in FIG. 3A may be consecutively arranged in the second direction DR2.

FIG. 3B is a cross-sectional view taken along line I-I' of FIG. 3A. FIG. 3B is a cross-section corresponding to a portion including a driving transistor T-D and a light emitting element OLED in a pixel area PXA.

The first display substrate 100 may include a first base substrate BS1, a circuit element layer DP-CL, a display element layer DP-OLED, and an upper insulating layer TFL. A stack structure of elements of the first display substrate 100 should not be particularly limited.

In an embodiment, the first display substrate 100 and the second display substrate 200 may be coupled to each other after being manufactured separately. A predetermined gap GP may be defined between the first display substrate 100 and the second display substrate 200. According to an embodiment, the gap GP may be defined by an empty space, however, it should not be limited thereto or thereby. In an alternative embodiment, the gap GP may be filled with a predetermined material, e.g., a transparent insulating material.

Referring to FIG. 3B, in an embodiment, the first display substrate 100 may include a plurality of insulating layers, a plurality of semiconductor patterns, a plurality of conductive patterns, and a plurality of signal lines. In an embodiment, an insulating layer, a semiconductor layer, and a conductive layer may be formed by a coating or depositing process. Then, the insulating layer, the semiconductor layer, and the conductive layer may be selectively patterned by a photo-lithography process. In such an embodiment, the semiconductor patterns, the conductive patterns, and the signal lines included in the circuit element layer DP-CL and the display element layer DP-OLED may be formed by processes described above.

The first base substrate BS1 may include a plastic substrate or a glass substrate. The circuit element layer DP-CL may include a buffer layer BFL, a first insulating layer 10, a second insulating layer 20, and a third insulating layer 30. The buffer layer BFL, the first insulating layer 10, and the second insulating layer 20 may be an inorganic layer, and the third insulating layer 30 may be an organic layer.

FIG. 3B shows an arrangement relation of an active A-D, a source S-D, a drain D-D, and a gate G-D that form the driving transistor T-D. The active A-D, the source S-D, and the drain D-D may be distinguished from each other according to a doping concentration or a conductivity of a semiconductor pattern.

The display element layer DP-OLED may include the light emitting element OLED. The light emitting element OLED may generate a source light. The light emitting element OLED may include a first electrode AE, a second electrode CE, and a light emitting layer EML disposed between the first electrode AE and the second electrode CE. According to an embodiment, the display element layer DP-OLED may include an organic light emitting diode. The display element layer DP-OLED may include a pixel definition layer PDL. In an embodiment, for example, the pixel definition layer PDL may be, but not limited to, an organic layer.

The first electrode AE may be disposed on the third insulating layer 30. The first electrode AE may be connected directly or indirectly to the driving transistor T-D. In FIG. 3B, a connection structure between the first electrode AE and the driving transistor T-D is not shown. An emission opening OP may be defined through the pixel definition layer PDL. At least a portion of the first electrode AE may be exposed through the emission opening OP of the pixel definition layer PDL. The emission opening OP may define a light emitting area LA in the first display substrate 100 to correspond to the first pixel area PXA-R. The first display substrate 100 may include the light emitting areas LA and a non-light-emitting area NLA, which respectively correspond to the pixel areas PXA-R, PXA-G, and PXA-B and the peripheral area NPXA shown in FIG. 3A.

A hole control layer HCL, the light emitting layer EML, and an electron control layer ECL may be commonly disposed in the first pixel area PXA-R and the peripheral area NPXA. The hole control layer HCL, the light emitting layer EML, and the electron control layer ECL may be commonly disposed in the first, second, and third pixel areas PXA-R, PXA-G, and PXA-B (refer to FIG. 3A).

The hole control layer HCL may include a hole transport layer and may further include a hole injection layer. The electron control layer ECL may include an electron transport layer and may further include an electron injection layer. The light emitting layer EML may generate the blue light as the source light. The blue light may have a wavelength from about 410 nanometers (nm) to about 480 nm. A light emission spectrum of the blue light may have a maximum peak in a range from about 440 nm to about 460 nm.

The light emitting layer EML may be commonly disposed in the first, second, and third pixel areas PXA-R, PXA-G, and PXA-B or may be independently disposed in corresponding first, second, and third pixel areas PXA-R, PXA-G, and PXA-B after being patterned.

The upper insulating layer TFL may be disposed on the second electrode CE to protect the second electrode CE. The upper insulating layer TFL may include an organic material or an inorganic material. The upper insulating layer TFL may have an encapsulation structure of inorganic layer/organic layer/inorganic layer.

The first display substrate 100 may include first, second, and third display elements respectively corresponding to the first, second, and third pixel areas PXA-R, PXA-G, and PXA-B shown in FIG. 3A. The first, second, and third display elements may have a same stack structure as each other and may have a stack structure corresponding to the stack structure of the light emitting element OLED shown in FIG. 3B.

In an embodiment, as shown in FIG. 3B, the second display substrate 200 may include a second base substrate BS2, a division pattern BM disposed on a lower surface BS2-LS of the second base substrate BS2, a color filter CF-R, a light conversion pattern CCF-R disposed under the color filter CF-R, and a division barrier wall BW. The division barrier wall BW may be defined as another division pattern.

In an embodiment, the second display substrate 200 may further include a plurality of insulating layers 200-1, 200-2, and 200-3. Each of the insulating layers 200-1, 200-2, and 200-3 may be an organic layer or an inorganic layer.

The second base substrate BS2 may include a plastic substrate or a glass substrate. The second base substrate BS2 may include an upper surface BS2-US and a lower surface BS2-LS. The division pattern BM may be disposed on the lower surface BS2-LS of the second base substrate BS2 to overlap the peripheral area NPXA.

In an embodiment, as shown in FIG. 3B, the division pattern BM may have a multi-layer structure. In such an embodiment, a first layer BM-1 of the division pattern BM may include the same material as that of the color filter that transmits the blue light, and a second layer BM-2 of the division pattern BM may include a well-known black coloring agent. The second layer BM-2 may include a black dye or a black pigment mixed with a base resin.

In an embodiment, an opening BM1-OP may be defined through the division pattern BM to correspond to the first pixel area PXA-R. In an embodiment, the opening BM1-OP of the first layer BM-1 may define a pixel area PXA, e.g., the first pixel area PXA-R.

The color filter CF-R may transmit a light in a specific wavelength range and may block a light in a wavelength range other than the light in the specific wavelength range. The color filter CF-R may include a base resin and a dye and/or a pigment dispersed in the base resin. The base resin may be a medium in which the dye and/or the pigment is dispersed and may include various resin compositions that are generally referred to as a binder.

The light conversion pattern CCF-R may change an optical property of the source light. In an embodiment, the light conversion pattern CCF-R may absorb the source light generated by the light emitting element OLED and may generate a light having a color different from that of the source light. In an embodiment, for example, the light conversion pattern CCF-R disposed in the first pixel area PXA-R may absorb the source light and may generate the red light.

The light conversion pattern CCF-R may include a base resin, quantum dots mixed with (or dispersed in) the base resin, and scatterers mixed with (or dispersed in) the base resin.

The quantum dots may be particles that change a wavelength of light incident thereto. The quantum dots are a material having a crystal structure of several nanometers in size, contain hundreds to thousands of atoms, and exhibit a quantum confinement effect in which an energy band gap increases due to a small size. When a light having a wavelength with an energy higher than the band gap is incident into the quantum dots, the quantum dots absorb the light and become excited, and then, the quantum dots emit a light of a specific wavelength and fall to a ground state. The emitted light of the specific wavelength has an energy of a value corresponding to the band gap. The light-emitting property of the quantum dots due to the quantum confinement effect may be controlled by adjusting the size and the composition of the quantum dots.

The quantum dots may be selected from a group II-VI compound, a group compound, a group III-V compound, a group IV-VI compound, a group IV element, a group IV compound, and a combination thereof.

The group II-VI compound may be selected from a binary compound selected from CdSe, CdTe, CdS, ZnS, ZnSe, ZnTe, ZnO, HgS, HgSe, HgTe, MgSe, MgS, and a mixture thereof, a ternary compound selected from AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group compound may include a ternary compound selected from AgInS2, CuInS2, AgGaS2, CuGaS2, and a mixture thereof, or a quaternary compound of AgInGaS2, CuInGaS2, or the like.

The group III-V compound may be selected from a binary compound selected from GaN, GaP, GaAs, GaSb, AlN, AlP, AlAs, AlSb, InN, InP, InAs, InSb, and a mixture thereof, a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. In an embodiment, for example, InZnP may be selected as a group III-II-V compound.

The group IV-VI compound may be selected from a binary compound selected from SnS, SnSe, SnTe, PbS, PbSe, PbTe, and a mixture thereof, a ternary compound selected from SnSeS, SnSeTe, SnSTe, PbSeS, PbSeTe, PbSTe, SnPbS, SnPbSe, SnPbTe, and a mixture thereof, and a quaternary compound selected from SnPbSSe, SnPbSeTe, SnPbSTe, and a mixture thereof. The group IV element may be selected from Si, Ge, and a mixture thereof. The group IV compound may be a binary compound selected from SiC, SiGe, and a mixture thereof.

In an embodiment, the binary compound, the ternary compound, or the quaternary compound may exist in the particles at a uniform concentration or may exist in the same particle after being divided into plural portions having different concentrations.

In an embodiment, each quantum dot may have a core-shell structure that includes a core and a shell surrounding the core. In an embodiment, each quantum dot may have a core-shell structure where one quantum dot surrounds another quantum dot. An interface between the core and the shell may have a concentration gradient in which a concentration of elements existing in the shell is lowered as a distance from the core decreases.

The quantum dots may be nanometer-scale particles. The quantum dots may have a full width at half maximum ("FWHM") of the light emission wavelength spectrum of about 45 nm or less, e.g., about 40 nm or less, or about 30 nm or less. A color purity and a color reproducibility may be improved within this range. In such an embodiment, since the light emitted through the quantum dots may be emitted in all directions, an optical viewing angle may be improved.

In an embodiment, the quantum dots may have a shape that is commonly used in the art, and the shape of the quantum dots should not be particularly limited. In an embodiment, spherical, pyramidal, multi-arm, or cubic nanoparticles, nanotubes, nanowires, nanofibers, nanoplatelets, or the like may be applied to the quantum dots. The quantum dots may control the color of the light emitted therefrom according to a size thereof, and thus, the quantum dots may have a variety of light emitting colors such as the blue light, the red light, the green light, and the like.

The base resin may be a medium in which the quantum dots are dispersed and may include various resin compositions that are generally referred to as a binder, however, it should not be limited thereto or thereby. In an disclosure, any medium in which the quantum dots are dispersed may be referred to as the base resin regardless of name, additional functions, materials, etc. The base resin may be a polymer resin. In an embodiment, for example, the base resin may be an acrylic-based resin, a urethane-based resin, a silicone-based resin, or an epoxy-based resin. The base resin may be a transparent resin.

The scatterer may scatter a light generated by the light conversion pattern or a light passing through the light conversion pattern. The scatterers may be particles having a relatively large density or specific gravity. The scattering particles may include titanium oxide ($TiO_2$) or silica-based nano particles.

Some light conversion patterns among the light conversion patterns corresponding to the first pixel area PXA-R, the second pixel area PXA-G, and the third pixel area PXA-B may include the quantum dots, and some light conversion patterns among the light conversion patterns may not include the quantum dots. in an embodiment, the light conversion pattern that does not include the quantum dots may be determined according to the color of the source light generated by the light emitting element OLED.

In an embodiment, the third pixel PXA-B that provides the blue light may provide the source light after scattering the source light. Accordingly, the light conversion pattern of the third pixel area PXA-B may not include the quantum dots.

The division barrier wall BW may be disposed under the second insulating layer 200-2. In an embodiment, the division barrier wall BW may include a base resin and an additive. The base resin may include various resin compositions that are generally referred to as a binder. The additive may include a coupling agent and/or a photoinitiator. The additive may further include a dispersant.

The division barrier wall BW may include a black coloring agent. The division barrier wall BW may include a black dye or a black pigment mixed with a base resin. According to an embodiment, the black coloring agent may include carbon black, a metal material, such as chromium, or the like, or oxides thereof. The second layer BM-2 may be, for example, a black matrix.

The light conversion pattern CCF-R may be disposed in an opening BW-OPR defined by the division barrier wall BW. The light conversion pattern CCF-R may be formed through an inkjet process.

FIG. 3C shows a portion of the manufacturing process of the second display substrate 200. FIG. 3C shows a cross-section taken along line II-IF of FIG. 3A.

The division barrier wall BW may define the first opening BW-OPR, a second opening BW-OPG, and a third opening BW-OPB, which are defined therethrough to respectively correspond to the first pixel area PXA-R, the second pixel area PXA-G, and the third pixel area PXA-B.

An inkjet apparatus may include a plurality of head units for providing different liquid compositions from each other. FIG. 3C shows one nozzle N-R (hereinafter, referred to as a first nozzle) of a first head unit, one nozzle N-G (hereinafter, referred to as a second nozzle) of a second head unit, and one nozzle N-B (hereinafter, referred to as a third nozzle) of a third head unit.

The first nozzle N-R may provide a first composition CCF-LR to the first opening BW-OPR, the second nozzle N-G may provide a second composition CCF-LG to the second opening BW-OPG, and the third nozzle N-B may provide a third composition CCF-LB to the third opening BW-OPB. Each of the first composition CCF-LR, the second composition CCF-LG, and the third composition CCF-LB may include a liquid resin composition and the scatterer. According to an embodiment, each of the first composition CCF-LR, the second composition CCF-LG, and the third composition CCF-LB may include a solvent, the resin composition dissolved in the solvent, and the scatterer mixed with the solvent. The first composition CCF-LR may further include red quantum dots, and the second composition CCF-LG may further include green quantum dots. The third composition CCF-LB may include the scatterer having a relatively large weight ratio compared with the first composition CCF-LR and the second composition CCF-LG.

FIG. 3C shows the first nozzle N-R, the second nozzle N-G, and the third nozzle N-B that are substantially simultaneously disposed in the first opening BW-OPR, the second opening BW-OPG, and the third opening BW-OPB, respectively, for the convenience of illustration, however, they should not be limited thereto or thereby. The first nozzle N-R, the second nozzle N-G, and the third nozzle N-B may provide compositions corresponding to the first opening BW-OPR, the second opening BW-OPG, and the third opening BW-OPB at different timings from each other.

FIG. 3D is a cross-sectional view showing the display device DP according to an embodiment of the disclosure. FIG. 3E is a cross-sectional view showing a portion of a manufacturing process of the display device DP according to an embodiment of the disclosure. Hereinafter, any repetitive detailed description of the same elements as those described above with reference to FIGS. 3A to 3C will be omitted.

Referring to FIG. 3D, an embodiment of the display device DP may include a single base substrate BS. In an embodiment of the manufacturing process, a process of coupling the first display substrate 100 (refer to FIG. 3B) to the second display substrate 200 (refer to FIG. 3B) may be omitted, and elements may be sequentially formed on the base substrate BS.

Referring to FIG. 3D, an embodiment of the display device DP may include the base substrate BS, a circuit element layer DP-CL disposed on the base substrate BS, a display element layer DP-OLED disposed on the circuit element layer DP-CL, and an upper insulating layer TFL disposed on the display element layer DP-OLED. In such an embodiment, these elements are the same as those described above, and any repetitive detailed descriptions thereof will be omitted.

A light control layer OSL may be disposed on the upper insulating layer TFL. The light control layer OSL may correspond to the second display substrate 200 described with reference to FIGS. 3B and 3C. Differences between the second display substrate 200 and the light control layer OSL may occur in the manufacturing process. Differently from the second display substrate 200 that is formed through a separate process from the first display substrate 100, the light control layer OSL may be formed on the upper insulating layer TFL through successive processes.

The light control layer OSL may include a division barrier wall BW, a light conversion pattern CCF-R, a color filter CF-R (or CF-G/CF-B in FIG. 3C), and a division pattern BM, which are disposed on the upper insulating layer TFL. In such an embodiment, a cross-sectional structure and a planar arrangement of the division barrier wall BW, the light conversion pattern CCF-R, the color filter CF-R, and the division pattern BM in the second display substrate 200 may be very similar to those of the light control layer OSL in an embodiment including the second display substrate 200 with the light control layer OSL.

In an embodiment, the light control layer OSL may further include a plurality of insulating layers 200-1, 200-2, and 200-3. A first insulating layer 200-1 of the insulating layers 200-1, 200-2, and 200-3 may be a base layer that provides a flat upper surface. The first insulating layer 200-1 may correspond to the second insulating layer 200-2 described with reference to FIG. 3B. According to an embodiment, the first insulating layer 200-1 may be omitted, and in such an embodiment the upper insulating layer TFL may correspond to the base layer.

Referring to FIG. 3E, the division barrier wall BW may be formed on the first insulating layer 200-1. A first composition CCF-LR may be provided in a first opening BW-OPR of the division barrier wall BW. FIG. 3E shows only the first opening BW-OPR among the first opening BW-OPR, the second opening BW-OPG, and the third opening BW-OPB of FIG. 3C.

Figure 4:
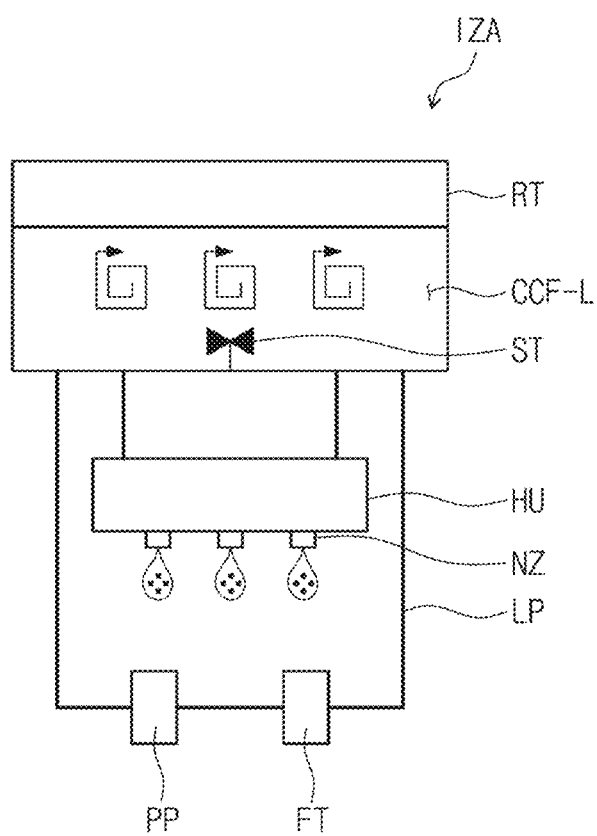
FIG. 4 is a view showing an inkjet apparatus according to an embodiment of the disclosure.

FIG. 4 is a view showing the inkjet apparatus IZA according to an embodiment of the disclosure.

An embodiment of the inkjet apparatus IZA may include a reservoir tank RT that stores a liquid composition CCF-L, an inkjet head unit HU, a circular path structure LP, a pump PP, a filter FT, and a stirrer ST. Although not shown in figures, the inkjet apparatus IZA may further include a mechanical equipment to move the inkjet head unit HU up and down or left and right. The mechanical equipment may include a robot arm.

The inkjet apparatus IZA may include a plurality of inkjet head units HU and a plurality of reservoir tanks RT. The inkjet apparatus IZA may include first, second, and third reservoir tanks that store the first composition CCF-LR, the second composition CCF-LG, and the third composition CCF-LB, respectively. The inkjet apparatus IZA may include first, second, and third inkjet head units that receives different compositions from the first, second, and third reservoir tanks, respectively. Each of the first, second, and third inkjet head units may be provided in plural in one inkjet apparatus IZA.

The inkjet head unit HU may include a plurality of nozzles NZ. The nozzles NZ may be controlled independently of each other. When some of the nozzles NZ are turned off (or in a locked state), others may be turned on (or in an unlocked state). An on and off interval, a lock and unlock interval, or a discharge and non-discharge interval of each of the nozzles NZ may be controlled.

The pump PP may circulate the liquid composition CCF-L to the external path of the reservoir tank RT via the circular path structure LP. The circulation of the liquid composition CCF-L may prevent a material therein with a large relative density or specific gravity, such as the scatterer, from being precipitated. The circular path structure LP may include a conventional pipe.

The filter FT may filter out the scatterer having a size larger than a predetermined size. It is desirable to filter out the large scatterer as the large scatterer may block an outlet of the nozzles NZ. The filter FT may be installed in the middle of the circular path structure LP.

The stirrer ST may circulate the liquid composition CCF-L inside the reservoir tank RT. The stirrer ST may prevent the precipitation of the scatterer and may uniformly disperse the scatterer in the liquid composition CCF-L.

According to an alternative embodiment, the circular path structure LP, the pump PP, and the filter FT may be omitted, the stirrer ST may be omitted, or all of the circular path structure LP, the pump PP, the filter FT, and the stirrer ST may be omitted from the inkjet apparatus IZA.

FIG. 5 shows an inkjet process according to a comparative example. FIG. 5 shows a inkjet apparatus in which one head unit HU includes four unit areas HA1, HA2, HA3, and HA4. Although not shown in figures, nozzles may be disposed in each of the unit areas HA1 to HA4.

A display substrate DS may include a plurality of unit display areas UD1, UD2, UD3, and UD4. Among the unit display areas UD1 to UD4, four unit display areas UD1 to UD4 are shown. The display substrate DS may be the second display substrate 200 shown in FIG. 3C or the display device DP shown in FIG. 3E. The pixel areas PXA-R, PXA-G, and PXA-B may be arranged in a predetermined rule or pattern in each of the unit display areas UD1 to UD4.

FIG. 5 shows three scanning stages. In the disclosure, the expression "scanning one time" means that the head unit HU moves from one end to the other end of one unit display area UD1 to UD4 and provides the composition to each of target pixel areas. When the composition is provided to each of target pixel areas, for example, a first composition is provided only to first pixel areas defined in one unit display area UD1 to UD4 and is not provided to a second pixel area or a third pixel area. The one end and the other end of the unit display areas UD1 to UD4 may be determined in a scanning direction, and the scanning direction may be the first direction DR1 in FIG. 5.

According to an embodiment, the head unit HU may move one way from one end to the other end of one unit display area or may reciprocate between one end and the other end of one unit display area UD1 to UD4 in one scanning stage. In a case of the one-way movement, when the head unit HU moves from one end to the other end of a first unit display area UD1 in a first scanning stage, the head unit HU may move from the other end to one end of a second unit display area UD2 in a second scanning stage.

Hereinafter, an embodiment of a process of inkjetting the liquid composition CCF-L including the scatterer will be described, however, it should not be particularly limited. The inkjetting of the liquid composition including particles with a large relative density may be performed for the inkjetting process.

Referring to FIG. 5, a first unit area HA' may provide the liquid composition to the first unit display area UD1 in the first scanning stage 1. In the first scanning stage 1, the nozzle of second to fourth unit areas HA2 to HA4 may be maintained in the turned-off state. The liquid composition provided to the first unit display area UD1 in the first scanning stage 1 may include the scatterer with the relatively large weight ratio. Since the nozzle of the first unit area HA' is maintained in the turned-off state before the first scanning stage 1, the precipitation of the scatterer may occur in the liquid composition introduced into the nozzle. The composition in the area in which the scatterer is precipitated (hereinafter, referred to as a composition in precipitation state) may be discharged in the first scanning stage 1.

After the first scanning stage 1, the head unit HU may be shifted downward. In the second scanning stage 2, the first unit area HA' may provide the composition to the second unit display area UD2. Since the composition in precipitation state is already provided to the first unit display area UD1, the composition in which the scatterer is normally dispersed (hereinafter, referred to as a composition in normal state) may be provided to the second unit display area UD2.

However, the composition provided to the first unit display area UD1 by the second unit area HA2 in the second scanning stage 2 may include the scatterer with the relatively large weight ratio. Since the second unit area HA2 is in the turned-off state in the first scanning stage, the precipitation state of the scatterer of the second unit area HA2 may correspond to or may increase more than the precipitation state of the scatterer of the first unit area HA' in the first scanning stage. Consequently, the composition including the scatterer with the large weight ratio is provided twice to the first unit display area UD1.

Through a third scanning stage 3 and subsequent scanning stages, the composition including the scatterer with the large weight ratio may be additionally provided to the first unit display area UD1. The composition in normal state may be provided to the second unit display area UD2 and the unit display areas disposed under the second unit display area UD2.

In such a inkjet process as described above, a concentration of the scatterer may vary greatly depending on the unit display areas. Consequently, a luminance difference may occur between the first unit display area UD1 and other unit display areas.

Figure 6A:
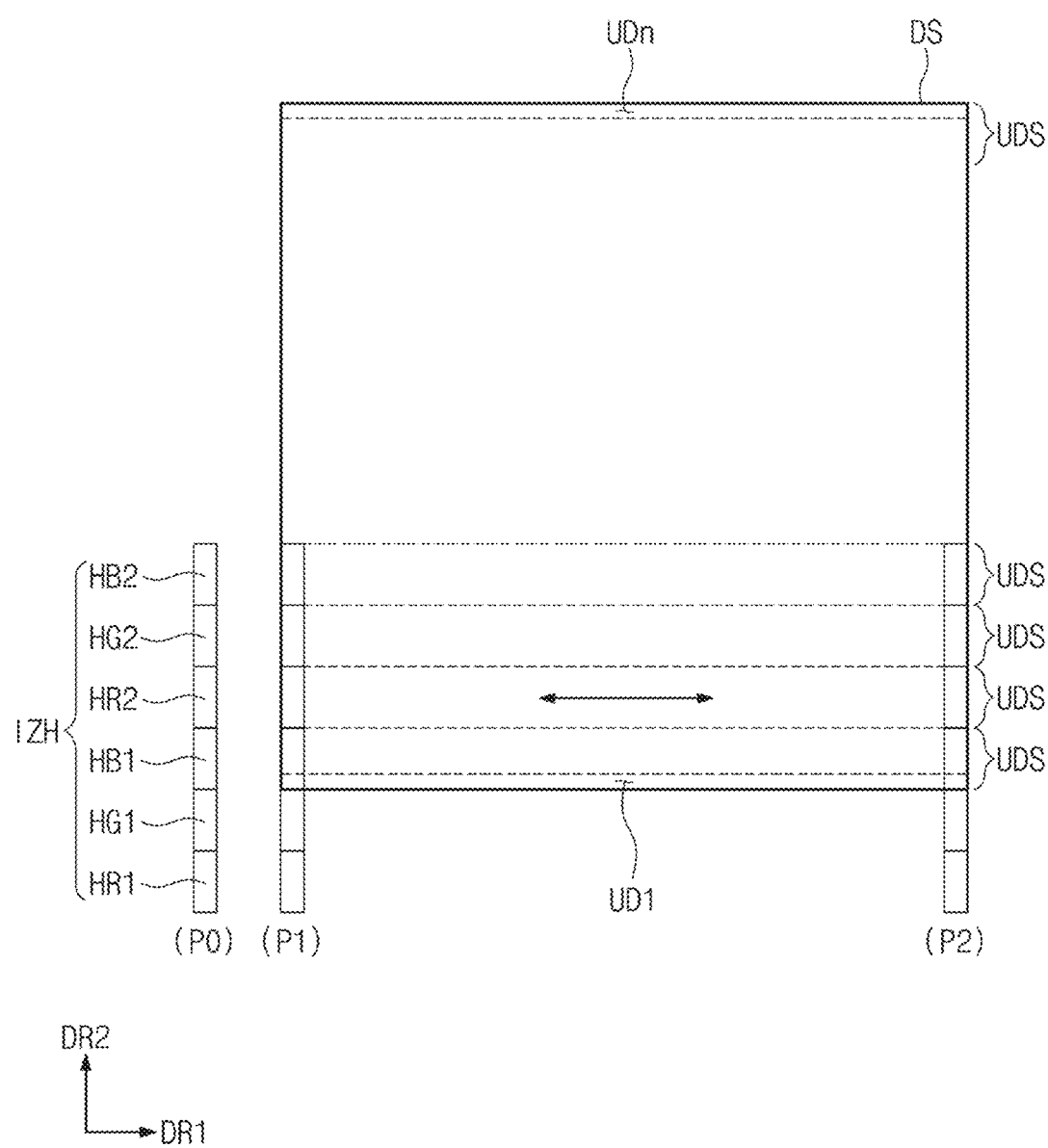
FIG. 6A is view showing a portion of an inject process according to an embodiment of the disclosure.
Figure 6B:
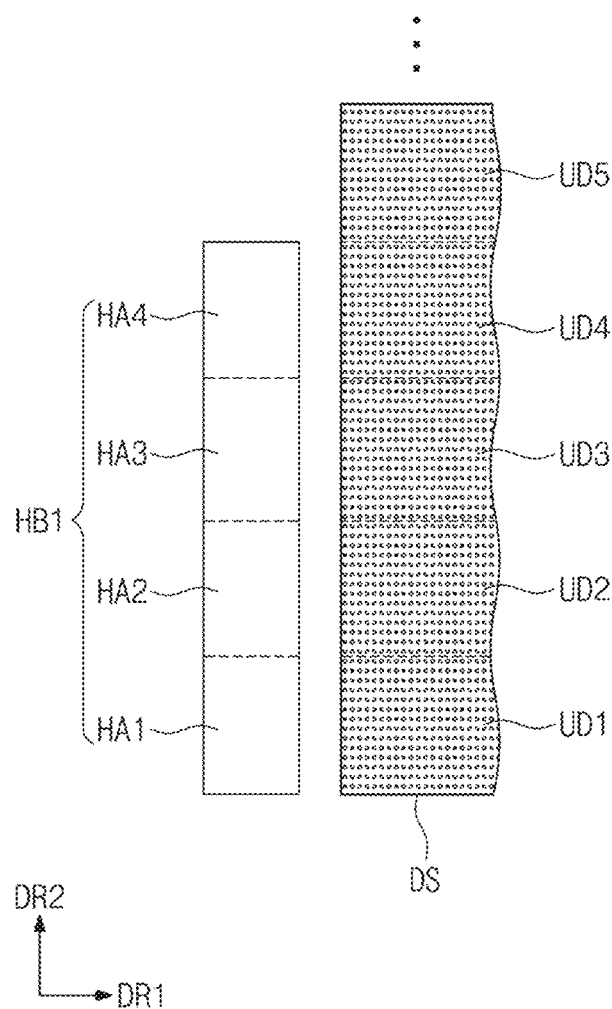
FIG. 6B is an enlarged view showing a portion of FIG. 6A.
Figure 6C:
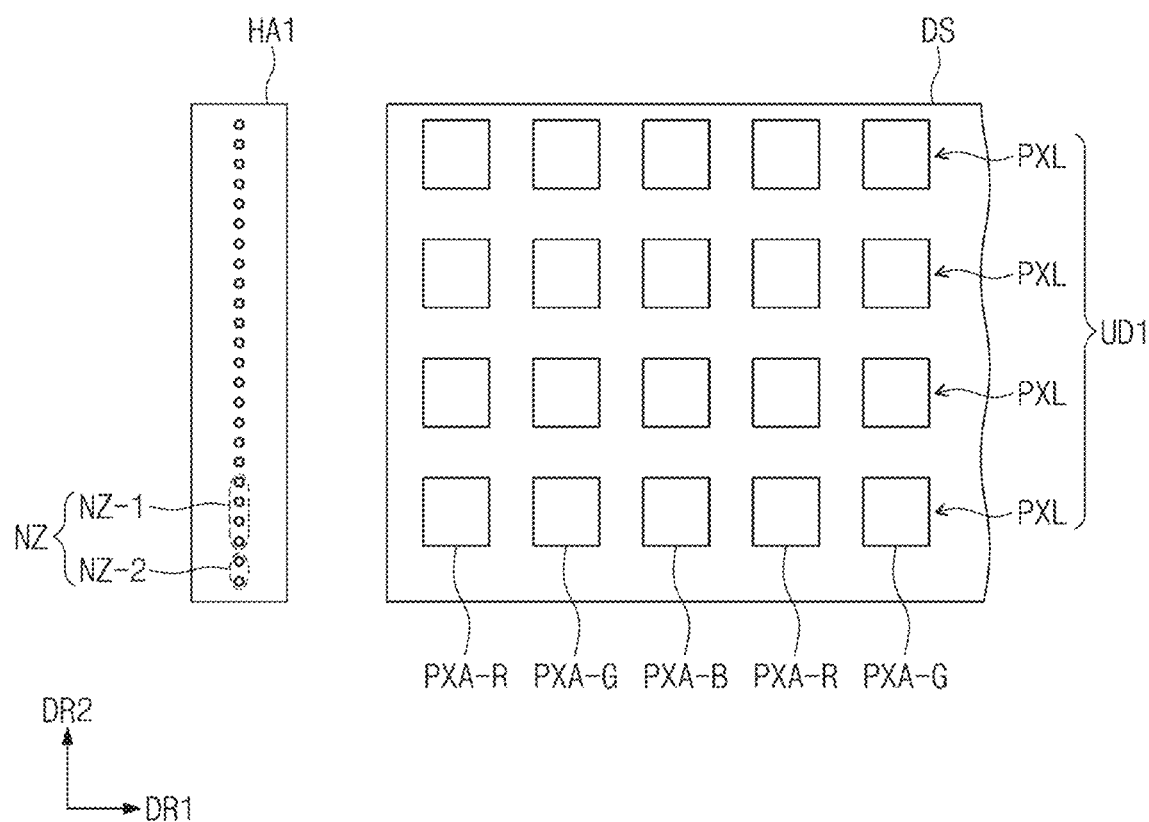
FIG. 6C is an enlarged view showing a portion of FIG. 6B.
Figure 6D:
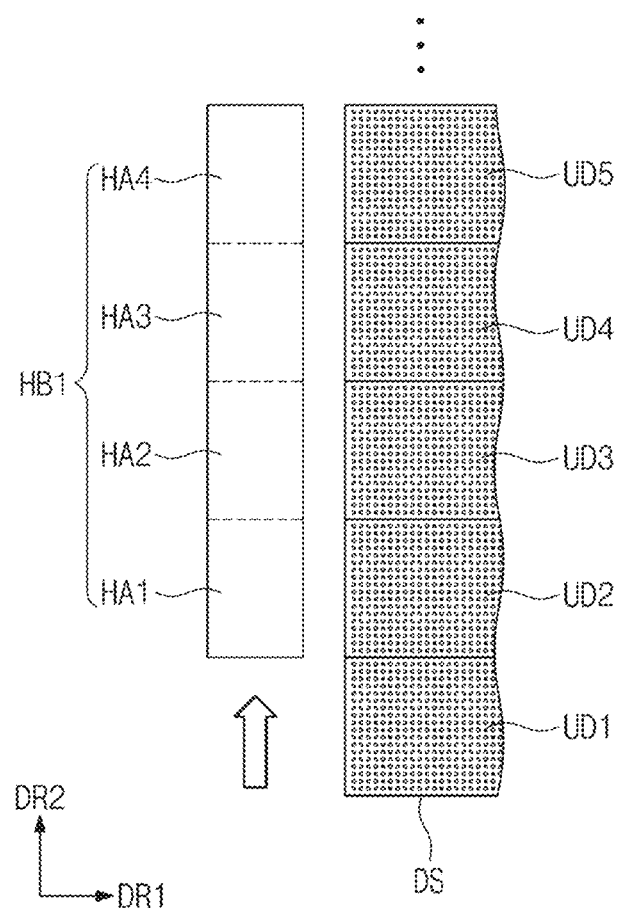
FIG. 6D is a view showing a state in which an inkjet head is shifted one time from a state in FIG. 6B.
Figure 6E:
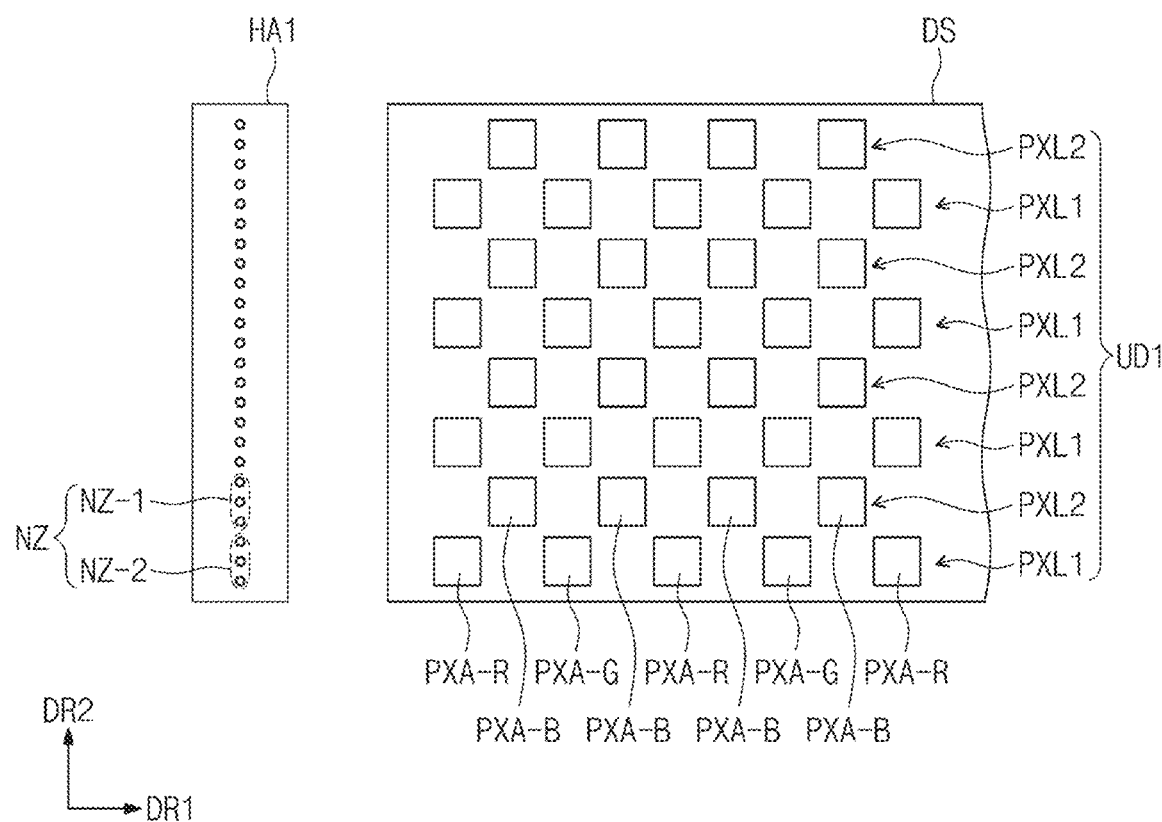
FIG. 6E is a plan view showing an arrangement relation between a head unit and a display substrate.

FIG. 6A is view showing a portion of the inject process according to an embodiment of the disclosure. FIG. 6B is an enlarged view showing a portion of FIG. 6A. FIG. 6C is an enlarged view showing a portion of FIG. 6B. FIG. 6D is a view showing a state in which an inkjet head is shifted once from a state in FIG. 6B. FIG. 6E is a plan view showing an arrangement relation between the head unit and the display substrate.

Referring to FIG. 6A, in an embodiment of the inkjet head IZH may include at least one head unit HR1, HG1, HB1, HR2, HG2, and HB2. In an embodiment, the inkjet head IZH including six head units HR1, HG1, HB1, HR2, HG2, and HB2 corresponding to two sets of head units, for example.

Two first head units HR1 and HR2 may provide the first composition CCF-LR (refer to FIG. 3C), two second head units HG1 and HG2 may provide the second composition CCF-LG (refer to FIG. 3C), and two third head units HB1 and HB2 may provide the third composition CCF-LR (refer to FIG. 3C). According to an embodiment, the inkjet head IZH may include only one head unit among the head units HR1, HG1, HB1, HR2, HG2, and HB2, may include one set of the head units, e.g., HR1, HG1, and HB1, or may include three or more sets of the head units.

In an embodiment, as shown in FIG. 6A, the inkjet head IZH may discharge or output the composition to the outside of the display substrate DS at a waiting point P0. The scatterer accumulated in the nozzle NZ (refer to FIG. 4) or the reservoir tank RT (refer to FIG. 4) may be discharged to the outside before the inkjet process starts.

In an embodiment, as shown in FIG. 6A, the inkjet head IZH may perform a scanning operation one time. In such an embodiment, the performing of the scanning operation one time may be defined as a reciprocation between a first point P1 and a second point P2. Among the head units HR1, HG1, HB1, HR2, HG2, and HB2, the head units HB1, HR2, HG2, and HB2 overlapping the display substrate DS may provide the composition to corresponding unit display areas.

Each of four head units HB1, HR2, HG2, and HB2 may overlap a plurality of unit display areas UDS. The four head units HB1, HR2, HG2, and HB2 may overlap the same number of the unit display areas UDS. In the embodiment, the display substrate DS may include n unit display areas. Here, n may be a natural number equal to or greater than 12. FIG. 6A shows the first unit display area UD1 and an n-th unit display area UDn.

In such an embodiment, the head units HR1 and HG1 that do not overlap the display substrate DS may be maintained in the turned-off state or may discharge the composition to the outside of the display substrate DS. When the head units HR1 and HG1 are maintained in the turned-off state, the composition may be prevented from being wasted, and a possibility of contamination of the display substrate DS may be reduced.

The arrangement relation between the inkjet head IZH and the display substrate DS will be described in detail with reference to FIGS. 6B to 6E. Descriptions will be focused on the third head unit HB1.

Referring to FIG. 6B, the head unit HB1 may include i unit areas HA1, HA2, HA3, and HA4 (i is a natural number equal to or greater than 2). In an embodiment, "i" may be 4. Four unit areas HA1, HA2, HA3, and HA4 may be defined sequentially from the bottom as first, second, third, and fourth unit areas HA1, HA2, HA3, and HA4.

Referring to FIG. 6B, the head unit HB1 may include the first, second, third, and fourth unit areas HA1, HA2, HA3, and HA4. The first, second, and third head units HR1, HG1, and HB1 shown in FIG. 6A may be distinguished from each other by the output composition, however, the first, second, third, and fourth unit areas HA1, HA2, HA3, and HA4 shown in FIG. 6B may be arbitrarily defined. As described below, the head unit HB1 may be divided into two unit areas or may be divided into three, four, or more unit areas according to a degree of shift of the head unit HB1 between the scanning stages.

Each of the first, second, third, and fourth unit areas HA1, HA2, HA3, and HA4 may correspond to one unit display area. As shown in FIG. 6B, the head unit HB1 may correspond to the first, second, third, and fourth unit display areas UD1, UD2, UD3, and UD4. The first, second, third, and fourth unit display areas UD1, UD2, UD3, and UD4 may extend in the first direction DR1 and may be arranged in the second direction DR2. The first unit display area UD1 may correspond to the first unit display area among the n unit display areas of the display substrate DS.

As the first unit display area UD1 shown in FIG. 6C, each of the first, second, third, and fourth unit display areas UD1, UD2, UD3, and UD4 may include a plurality of pixel rows PXL. Each of the pixel rows PXL may include the pixel areas PXA-R, PXA-G, and PXA-B. The pixel areas PXA-R, PXA-G, and PXA-B may be the pixel areas PXA-R, PXA-G, and PXA-B shown in FIG. 3C, and each of the pixel areas PXA-R, PXA-G, and PXA-B may be the pixel area PXA-R shown in FIG. 3E.

As the first unit area HA' shown in FIG. 6C, each of the first, second, third, and fourth unit areas HA1, HA2, HA3, and HA4 may include the plural nozzles NZ. The nozzles NZ may be arranged in the second direction DR2. FIG. 6C shows an embodiment having a structure in which the nozzles NZ define one column, however, it should not be limited thereto or thereby. According to an embodiment, the nozzles may define a plurality of columns.

The nozzles NZ may be turned on or off independently of each other, and FIG. 6C shows a first group of nozzles NZ-1 that are turned on in the scanning stage and a second group of nozzles NZ-2 that are turned off in the scanning stage. The nozzles NZ-1 of the first group may provide the third composition CCF-LB (refer to FIG. 3C) to the third pixel areas PXA-B during the scanning stage.

In an embodiment, the first head units HR1 and HR2, the second head units HG1 and HG2, and the third head units HB1 and HB2 shown in FIG. 6A may be substantially simultaneously scanned. Alternatively, the nozzles NZ-1 of the first group of the first head units HR1 and HR2, the second head units HG1 and HG2, and the third head units HB1 and HB2 may be turned on or off in different periods from each other. When the nozzles NZ-1 of the first group of the first head units HR1 and HR2 are switched to the turned-off state from the turned-on state, the nozzles NZ-1 of the first group of the second head units HG1 and HG2 may be switched to the turned-on state from the turned-off state. When the nozzles NZ-1 of the first group of the second head units HG1 and HG2 are switched to the turned-off state from the turned-on state, the nozzles NZ-1 of the first group of the third head units HB1 and HB2 may be switched to the turned-on state from the turned-off state.

FIG. 6D shows the head unit HB1 shifted in the second direction DR2 after the first scanning stage. The head unit HB1 may be shifted in the second direction DR2 by the first unit display area UD1 for the second scanning stage.

In an embodiment, as described above, the head unit HB1 is defined to include the four unit areas HA1, HA2, HA3, and HA4 because the head unit HB1 is shifted by one fourth (¼) of a length of the head unit HB1 when the head unit HB1 is shifted one time. In a case where the head unit HB1 is shifted by one third (⅓) of the length of the head unit HB1 when the head unit HB1 is shifted one time, the head unit HB1 may be divided into three unit areas.

According to an embodiment of the display substrate DS shown in FIG. 6E, the first unit display area UD1 may include two types of pixel rows PXL1 and PXL2. First pixel rows PXL1 and second pixel rows PXL2 may be alternately arranged with each other in the second direction DR2. Each of the first pixel rows PXL1 may include the first pixel areas PXA-R and the second pixel areas PXA-G alternately arranged with the first pixel areas PXA-R in the first direction DR1. Each of the second pixel rows PXL2 may include the third pixel areas PXA-B arranged in the first direction DR1.

FIGS. 7A to 7F are plan views showing an inkjet process according to an embodiment of the disclosure. Hereinafter, any repetitive detailed description of the scanning stage that are the same as that described above with reference to FIGS. 6A to 6E will be omitted. Hereinafter, descriptions will be focused on two third head units HB1 and HB2.

In an embodiment, the head units HR1, HG1, HB1, HR2, HG2, and HB2 may have a same length in the second direction DR2 and may include a same number of the unit areas. In an embodiment, each of the head units HR1, HG1, HB1, HR2, HG2, and HB2 may include the first, second, third, and fourth unit areas HA1, HA2, HA3, and HA4 (refer to FIG. 6B). For convenience of description, the third head unit HB1 disposed at a lower side among the third head units HB1 and HB2 will be referred to as a lower head unit HB1, and the third head unit HB2 disposed at an upper side among the third head units HB1 and HB2 will be referred to as an upper head unit HB2.

In an embodiment, the inkjet process may include j scanning stages (hereinafter, referred to as a normal scanning stage) of the inkjet head IZH (j is a natural number equal to or greater than 2). In the first scanning stage 1, each of the third head units HB1 and HB2 may entirely overlap the display substrate DS. In an embodiment, the display substrate DS may include a plurality of display areas, e.g., first to n-th display areas UD1 to UDn (n is a natural number equal to or greater than 2).

As shown in FIG. 7A, in the first scanning stage 1, i unit areas of the lower head unit HB1 may provide the composition to first to i-th unit display areas among the n unit display areas. In an embodiment, "i" may be 4. The composition may be the third composition CCF-LB of FIG. 3C.

In the first scanning stage 1, the lower head unit HB1 may provide the composition in the precipitation state to each of the first to fourth unit display areas UD1 to UD4 one time. After the first scanning stage 1, the lower head unit HB1 may provide the composition in the normal state.

In the second scanning stage 2, the lower head unit HB1 may provide the composition in the normal state to each of the second to fifth unit display areas UD2 to UD5 one time. In the third scanning stage 3, the lower head unit HB1 may provide the composition in the normal state to each of the third to sixth unit display areas UD3 to UD6 one time. In a fourth scanning stage 4, the lower head unit HB1 may provide the composition in the normal state to each of the fourth to seventh unit display areas UD4 to UD7 one time.

A cumulative number of the composition provided to the first to seventh unit display areas UD1 to UD7 after a fifth scanning stage 5, is shown in FIG. 7A. As the scanning stage increases, the unit display areas to which the composition in the normal state is provided four times may gradually increase after the fourth unit display area UD4.

Referring to the first scanning stage 1 to the fourth scanning stage 4, each of the first, second, third, and fourth unit areas HA', HA2, HA3, and HA4 (refer to FIG. 6B) may provide the composition to the fourth unit display area UD4 one time. Referring to the second scanning stage 2 to the fifth scanning stage 5, each of the first, second, third, and fourth unit areas HA', HA2, HA3, and HA4 may provide the composition to the fifth unit display area UD5 one time.

The fourth unit display area UD4 may receive the composition in the precipitation state one time and may receive the composition in the normal state three times. The fifth unit display area UD5 may receive the composition in the normal state four times. As the scanning stage is additionally performed, the unit display areas after the fifth unit display area UD5 may be in the same state as that of the fifth unit display area UD5.

In a case where one unit area performs the scanning operation four times on one unit display area, a difference in the volume of the provided compositions for each unit display area or a difference in the weight ratio of the scatterer for each unit display area may occur. This is because the first, second, third, and fourth unit areas HA1, HA2, HA3, and HA4 may have different inkjet performances. In an embodiment of the invention, the above-mentioned differences may be reduced by allowing each unit display area to be scanned one time by the first to fourth unit areas HA1, HA2, HA3, and HA4 as described above.

Figure 7B:
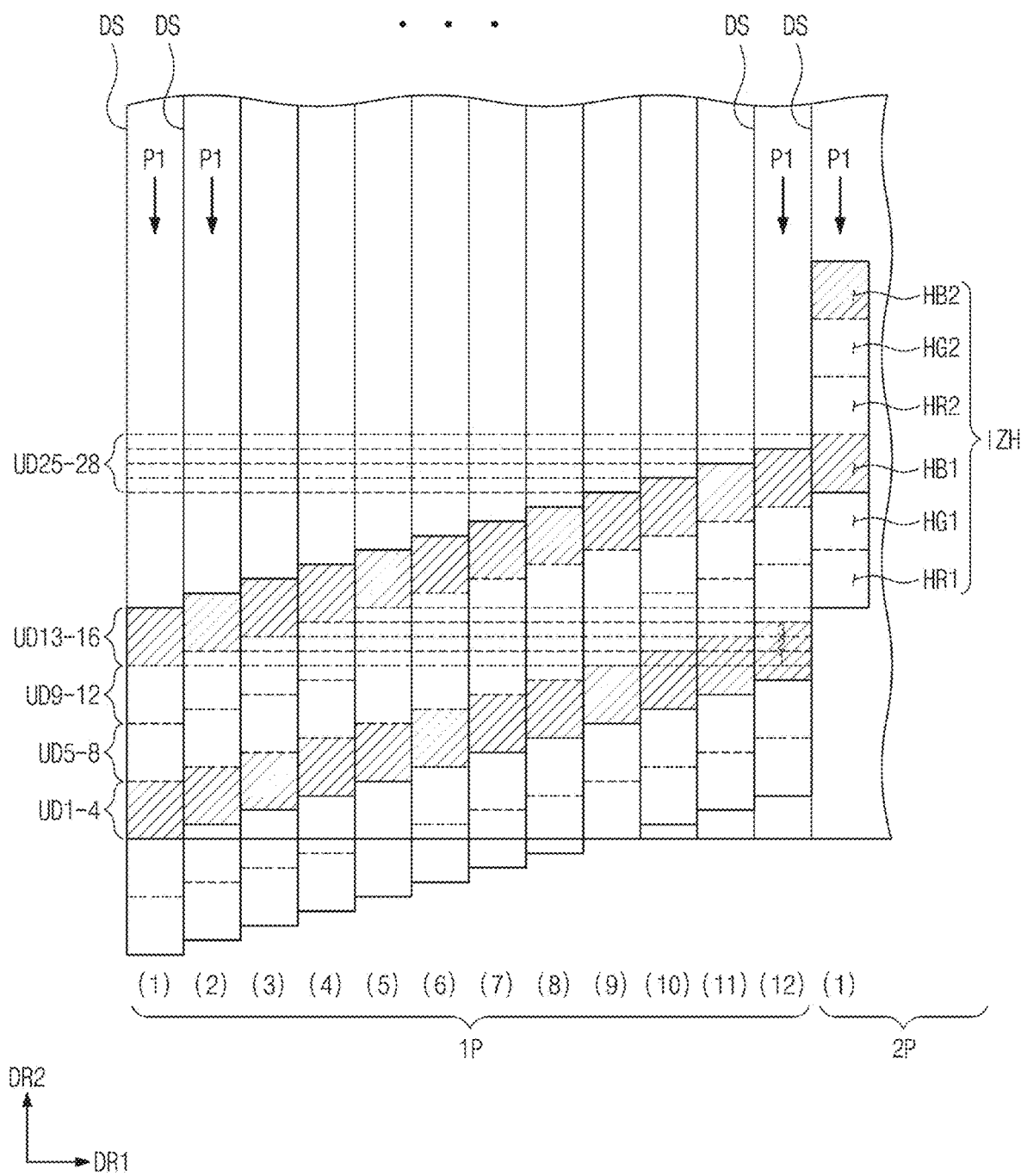

FIG. 7B shows a scanning stage of a first period 1P. FIG. 7B continuously shows only a first points P1 of the scanning stages shown in FIG. 7A.

During the first period 1P, first to twelfth scanning stages 1 to 12 may be performed. During the twelve scanning operations, the inkjet head IZH may be shifted eleven times in the second direction DR2. Unless otherwise specified below, the shift of the inkjet head IZH means that the inkjet head IZH moves in the second direction DR2.

In an embodiment, one set of the head units HR1, HG1, and HB1 includes twelve unit areas such that the first period 1P includes the twelve scanning stages.

In the tenth to twelfth scanning stages, the lower head unit HB1 may respectively scan the unit display areas UD13 to UD 15 three times, two times, and one time that are respectively scanned one time, two times, and three times by the upper head unit HB2. Thirteenth to fifteenth unit display areas UD13 to UD 15 may be compensation-scanned by the lower head unit HB1.

When the first period 1P is changed to a second period 2P, the inkjet head IZH may be shifted more than a shift value between the successive scanning stages. In an embodiment, the inkjet head IZH includes a first set of the head units HR1, HG1, and HB1 and a second set of the head units HR2, HG2, and HB2 such that the operation of the inkjet head IZH includes the first and second periods 1P and 2P.

In a case where the inkjet head IZH includes only the first set of the head units HR1, HG1, and HB1, the inkjet head IZH may not be shifted rapidly. Accordingly, the periods 1P and 2P may not be distinguished from each other. The inkjet head IZH may be shifted in every scanning stage by one unit display area or one unit area HA', HA2, HA3, and HA4

(refer to FIG. 6B) until the first head unit HR1 scans the n-th unit display area or the last unit display area.

When the first period 1P is changed to the second period 2P, the inkjet head IZH may be shifted such that the lower head unit HB1 overlaps twenty-fifth to twenty-eighth unit display areas UD25 to UD28 to additionally scan the twenty-fifth to twenty-seventh unit display areas UD25 to UD27 that are respectively scanned three times, two times, and one time by the upper head unit HB2.

FIG. 7C shows the inkjet head IZH in a state in which m periods 1P to mP of scanning operations are performed (m is a natural number equal to or greater than 2). According to FIG. 7C, the first, second, third, and fourth unit areas HA1, HA2, HA3, and HA4 (refer to FIG. 6B) of the upper head unit HB2 may respectively scan (n−3)-th to n-th unit display areas UDn−3, UDn−2, UDn−1, and UDn in the last scanning stage of the m periods mP. The (n−3)-th to n-th unit display areas UDn−3, UDn−2, UDn−1, and UDn are scanned four times, three times, two times, and one time, respectively.

Figure 7D:
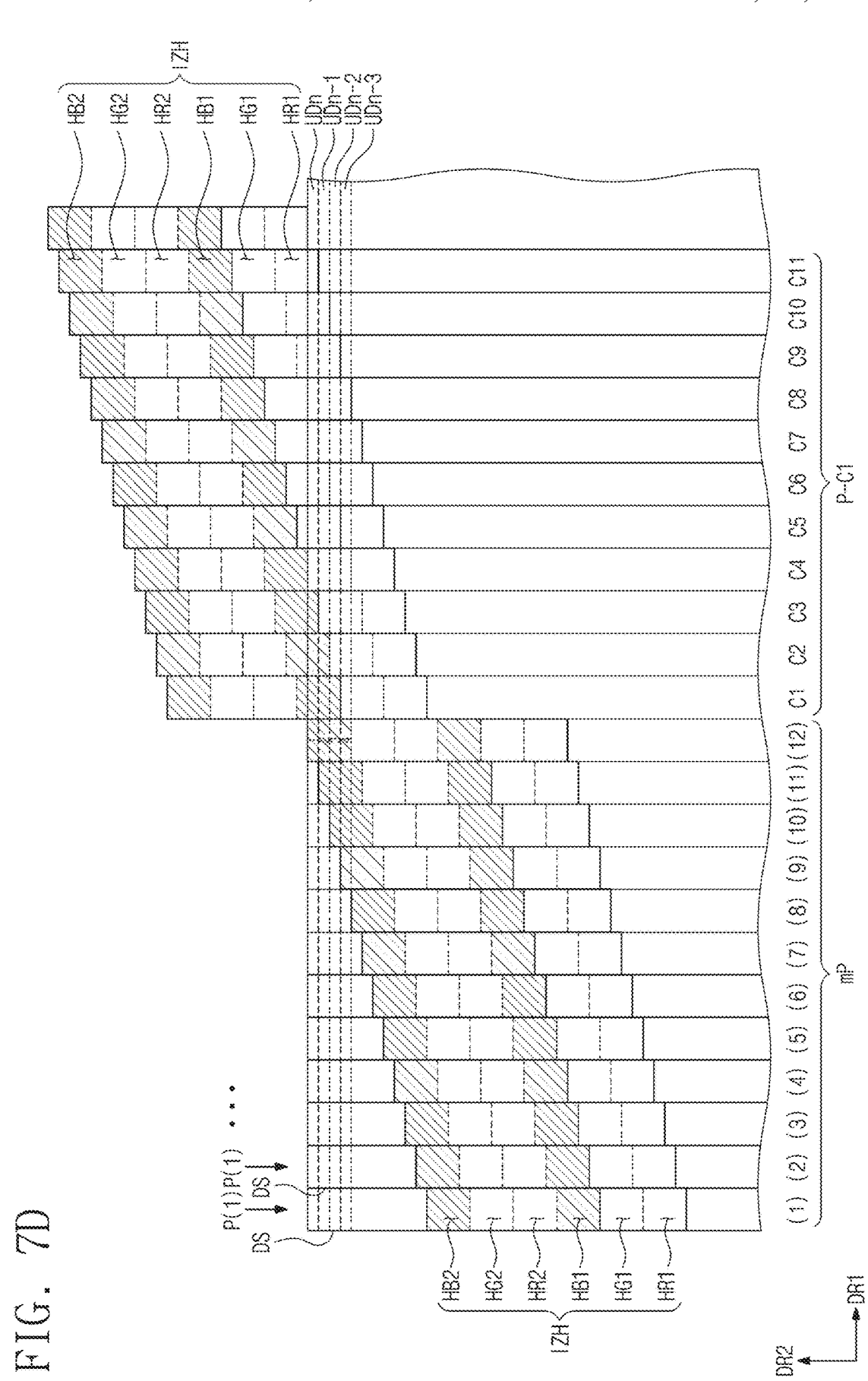

Referring to FIG. 7D, the inkjet head IZH may be shifted such that the lower head unit HB1 overlaps the (n−2)-th to n-th unit display areas UDn−2, UDn−1, and UDn to successively scan the (n−2)-th to n-th unit display areas UDn−2, UDn−1, and UDn, which are respectively scanned three times, two times, and one time by the upper head unit HB2 in the m-th period mP, after the m-th period mP. This scanning stage may be defined as a first compensation-scanning stage P-C1.

In an embodiment, "i" may be 4, and the (n−2)-th to n-th unit display areas UDn−2, UDn−1, and UDn, i.e., three unit display areas, may be first compensation-scanned, however, the disclosure should not be limited thereto or thereby. In an embodiment, the lower head unit HB1 may perform the first compensation-scanning operation on (n−(i−2))-th to n-th unit display areas.

In an embodiment, the first compensation-scanning stage P-C1 may be performed continuously with one of the scanning stages after the last scanning stage of the m periods mP or a j-th normal scanning stage of j normal scanning stages such that the precipitation of the scatterer in the upper head unit HB2 or the lower head unit HB1 may be effectively prevented.

In the first compensation-scanning stage P-C1, the first to third unit areas HA', HA2, and HA3 (refer to FIG. 6B) of the lower head unit HB1 may be disposed to respectively overlap the (n−2)-th to n-th unit display areas UDn−2, UDn−1, and UDn. The (n−2)-th to n-th unit display areas UDn−2, UDn−1, and UDn may be compensation-scanned one time, two times, and three times through the first to third scanning stages C1 to C3 sequentially performed.

Then, the (n−3)-th to n-th unit display areas UDn−3, UDn−2, UDn−1, and UDn may be compensation-scanned one time, two times, three times, and four times using a lower second head unit HG1 through the fourth to seventh scanning stages C4 to C7 sequentially performed. Finally, the (n−3)-th to n-th unit display areas UDn−3, UDn−2, UDn−1, and UDn may be compensation-scanned one time, two times, three times, and four times using a lower first head unit HR1 through eighth to eleventh scanning stages C8 to C11 sequentially performed.

In an embodiment, as described above, as a result of the first to third scanning stages C1 to C3 of the first compensation-scanning stage P-C1 described above, each of the third pixel areas PXA-B (refer to FIG. 6E) disposed in the (n−2)-th to n-th unit display areas UDn−2, UDn−1, and UDn may receive the third composition four times. In such an embodiment, as a result of the fourth to seventh scanning stages C4 to C7 of the first compensation-scanning stage P-C1, each of the second pixel areas PXA-G (refer to FIG. 6E) disposed in the (n−3)-th to n-th unit display areas UDn−3, UDn−2, UDn−1, and UDn may receive the second composition four times. In such an embodiment, as a result of the eighth to eleventh scanning stages C8 to C11 of the first compensation-scanning stage P-C1, each of the first pixel areas PXA-R (refer to FIG. 6E) disposed in the (n−3)-th to n-th unit display areas UDn−3, UDn−2, UDn−1, and UDn may receive the first composition four times.

FIG. 7E shows the inkjet head IZH in the state in which the m-th period mP is performed (m is a natural number equal to or greater than 2). Referring to FIG. 7E, in an embodiment, the first, second, third, and fourth unit areas HA1, HA2, HA3, and HA4 of the upper head unit HB2 may respectively scan the (n−3)-th to n-th unit display areas UDn−3, UDn−2, UDn−1, and UDn in the eighth scanning stage 8 of the m-th period mP. As described above, different from the periods shown in FIG. 7D, twelve scanning stages may not be completely performed in the last period. In such an embodiment, as described with reference to FIG. 7D, the first compensation-scanning stage P-C1 may be performed.

Figure 7F:
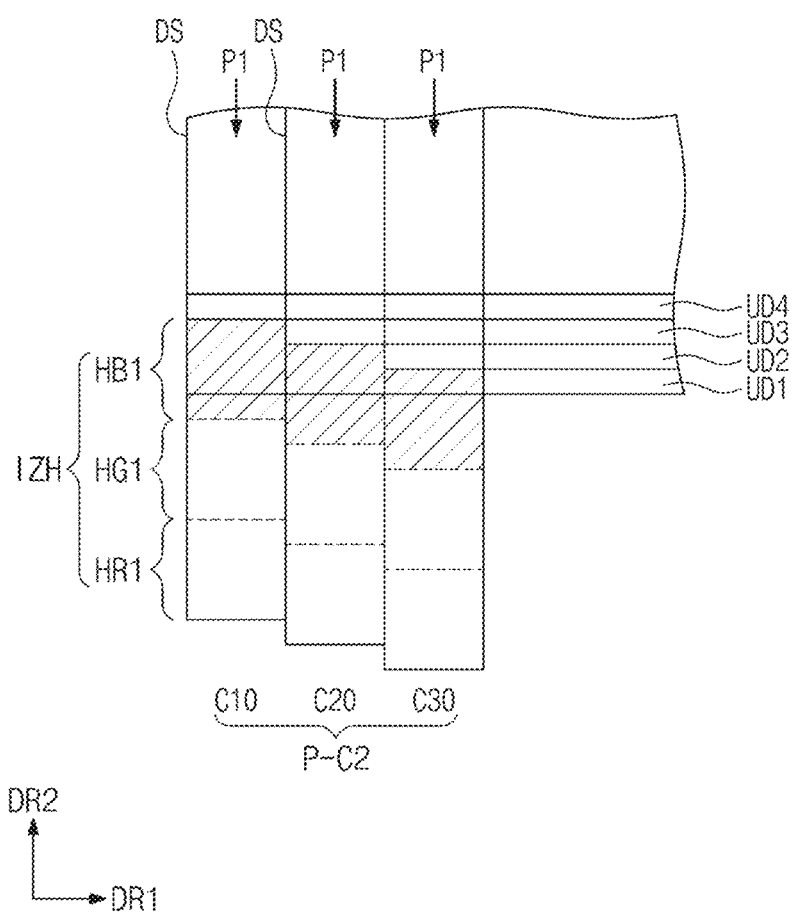

In an embodiment, as shown in FIG. 7F, the first, second, and third unit display areas UD1, UD2, and UD3 may be scanned using the upper head unit HB2 or the lower head unit HB1. This scanning stage may be defined as a second compensation-scanning stage P-C2.

Referring to FIG. 7A, the first, second, and third unit display areas UD1, UD2, and UD3 may be respectively scanned one time, two times, and three times by the lower head unit HB1 in the initial stage of scanning. The first, second, and third unit display areas UD1, UD2, and UD3 are not yet scanned four times. The second compensation-scanning stage P-C2 may be performed such that each of the first, second, and third unit display areas UD1, UD2, and UD3 is scanned four times after the first compensation-scanning stage of FIG. 7C or 7D.

After the first compensation-scanning stage P-C1, the second compensation-scanning stage P-C2 may be continuously performed. In such an embodiment, the upper head unit HB2 or the lower head unit HB1 may be used, but it is desired to use the lower head unit HB1 with a short turn-off period. In the nozzle of the lower head unit HB1, an amount of the precipitation of the scatterer may be relatively small. The upper head unit HB2 is not shown in FIG. 7F.

The second, third, and fourth unit areas HA2, HA3, and HA4 (refer to FIG. 6B) of the lower head unit HB1 may be disposed to overlap the third, second, and first unit display areas UD3, UD2, and UD1, respectively, to successively scan the third, second, and first unit display areas UD3, UD2, and UD1 that are respectively scanned three times, two times, and one time by the lower head unit HB1.

The second compensation-scanning stage P-C2 may include a plurality of scanning stages. The third, second, and first unit display areas UD3, UD2, and UD1 may be scanned one time, two times, and three times through first to third scanning stages C10 to C30 sequentially performed. During the three compensation-scanning operations, the inkjet head IZH may be shifted in a direction opposite to the second direction DR2.

In the first scanning stage C10, the second, third, and fourth unit areas HA2, HA3, and HA4 (refer to FIG. 6B) of the lower head unit HB1 may provide the first composition to the third, second, and first unit display areas UD3, UD2, and UD1 one time. Then, in the second scanning stage C20, the third and fourth unit areas HA3 and HA4 of the lower head unit HB1 may provide the first composition to the second and first unit display areas UD2 and UD1 one time.

In an embodiment, "i" may be 4, and the first, second, and third unit display areas UD1, UD2, and UD3, i.e., three unit display areas, may be second compensation-scanned, however, the disclosure should not be limited thereto or thereby. In an embodiment, the second compensation-scanning stage P-C2 may be performed on the first to (i−1)-th unit display areas.

In the second compensation-scanning stage P-C2, the unit areas of the first, second, and third unit display areas UD1, UD2, and UD3 that do not overlap the lower head unit HB1 may be in the turned-off state. The unit areas of the lower head unit HB1 that are switched to the turned-off state due to the shift operation may increase. In such an embodiment, the unit areas of the upper head unit HB2 may be maintained in the turned-off state in the second compensation-scanning stage P-C2.

Figure 8A:
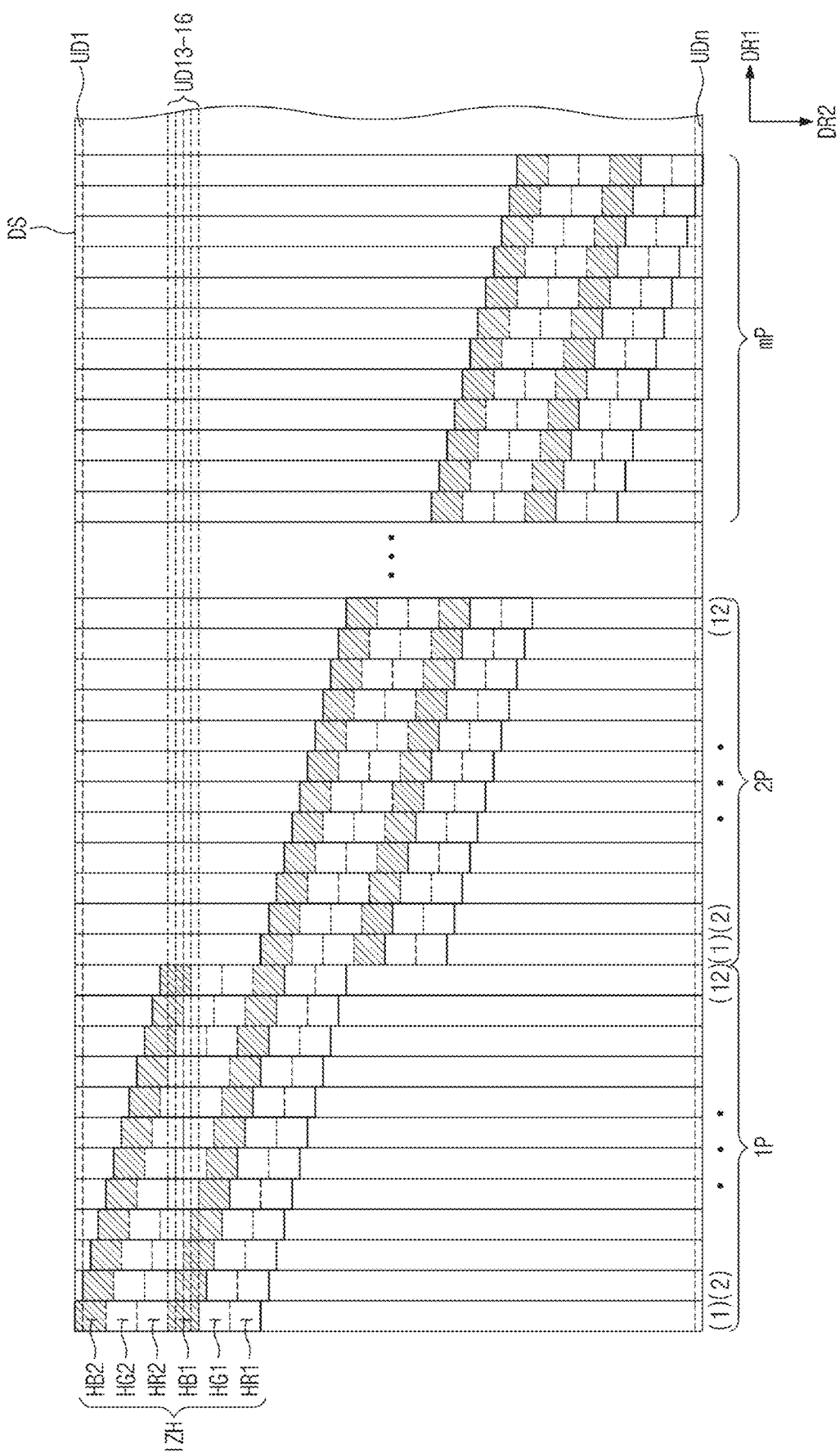
FIGS. 8A to 8C are plan views showing an inkjet process according to an embodiment of the disclosure.
Figure 8B:
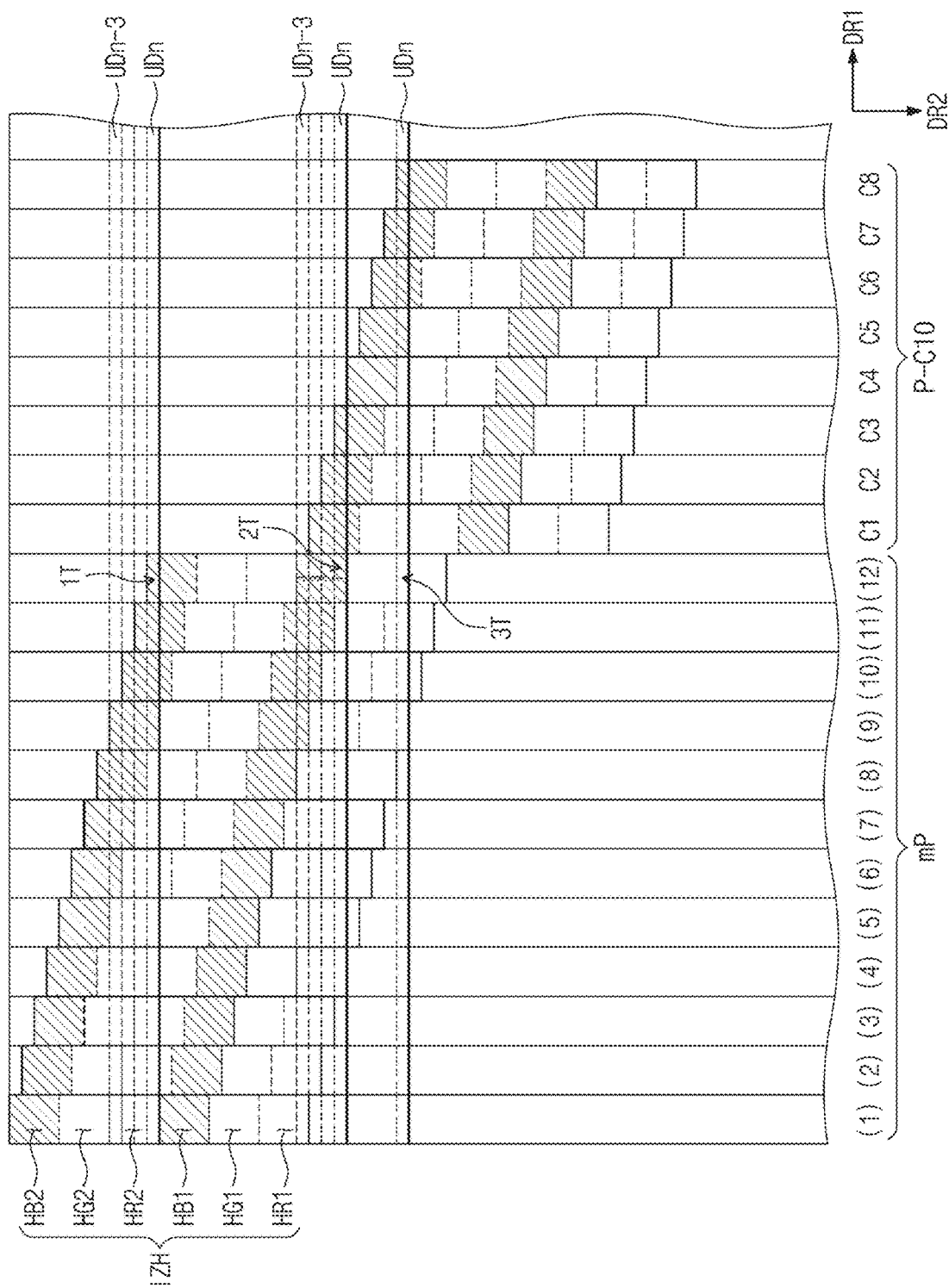
Figure 8C:
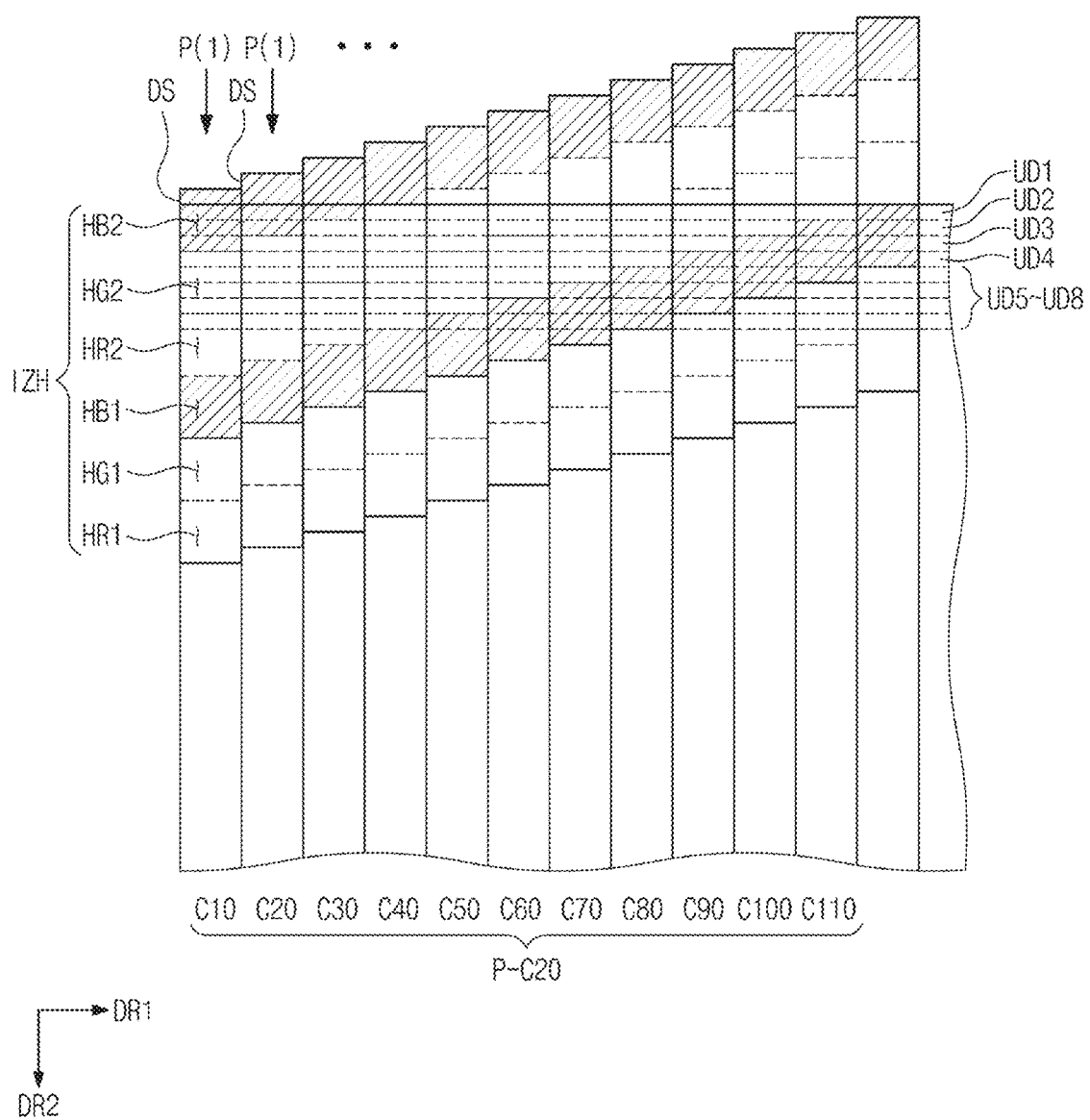

FIGS. 8A to 8C are plan views showing an inkjet process according to an embodiment of the disclosure. Hereinafter, any repetitive detailed description of the inkjet process that are the same as those described with reference to FIGS. 7A to 7F will be omitted.

The inkjet process shown in FIGS. 8A to 8C has different basic settings from those of the inkjet process shown in FIGS. 7A to 7F as described below. First, the direction opposite to the second direction DR2 described with reference to FIGS. 7A to 7F is set as the second direction DR2. Second, the arrangement order of the first unit display area UD1 to the n-th unit display area UDn is opposite to that described with reference to FIGS. 7A to 7F.

Referring to FIG. 8A, each of the upper head unit HB2 and the lower head unit HB1 may scan j times. FIG. 8A shows scanning stages of m periods 1P to mP.

In the first scanning stage 1 of the first period 1P, the upper head unit HB2 may provide the composition including the scatterer with the relatively large weight ratio to each of the first to fourth unit display areas UD1 to UD4 one time. After the first scanning stage 1 of the first period 1P, the upper head unit HB2 may provide the composition in the normal state. In the first scanning stage 1 of the first period 1P, the lower head unit HB1 may provide the composition including the scatterer with the relatively large weight ratio to each of the thirteenth to sixteenth unit display areas UD13 to UD16 one time. After the first scanning stage 1 of the first period 1P, the lower head unit HB1 may provide the composition in the normal state.

In the first period 1P, the thirteenth to fifteenth unit display areas UD13 to UD15 may be compensation-scanned by the upper head unit HB2. When the first period 1P is changed to the second period 2P, the inkjet head IZH may be shifted more than the shift value between the successive scanning stages.

FIG. 8B shows the inkjet head IZH in the state in which the m-th period mP is performed (m is a natural number equal to or greater than 2). FIG. 8B shows the last scanning stage of three types of the m-th period mP.

The last scanning stage of a first type 1T of the m-th period mP is shown at an upper side. The fourth unit area HA4 (refer to FIG. 6B) of the upper head unit HB2 may scan the n-th unit display area UDn. Accordingly, each of the (n−3)-th to n-th unit display areas UDn-3 to UDn may be scanned four times. According to an alternative embodiment, the first compensation-scanning stage P-C1 may be omitted.

The scanning stage of a second type 2T of the m-th period mP is shown at a middle position. The first unit area HA' (refer to FIG. 6B) of the lower head unit HB1 may scan the n-th unit display area UDn. Accordingly, the (n−3)-th to n-th unit display areas UDn-3 to UDn may be respectively scanned four times, three times, two times, and one time. According to an embodiment, the first compensation-scanning stage P-C10 may be performed.

The first to third scanning stages C1 to C3 of the first to eighth scanning stages C1 to C8 illustrated in FIG. 8B may be performed. The inkjet head IZH may be shifted such that the upper head unit HB2 overlaps the (n−2)-th to n-th unit display areas UDn-2, UDn-1, and UDn. In the first compensation-canning stage P-C10, the second, third, and fourth unit areas HA2, HA3, and HA4 (refer to FIG. 6B) of the upper head unit HB2 may be disposed to overlap the n-th to (n−2)-th unit display areas UDn, UDn-1, and UDn-2, respectively. The (n−2)-th to n-th unit display areas UDn-2, UDn-1, and UDn may be respectively scanned one time, two times, and three times through the first to third scanning stage C1 to C3 sequentially performed.

The last scanning stage of a third type 3T of the m-th period mP is shown at a lower side. The fourth unit area HA4 (refer to FIG. 6B) of the lower first head unit HR1 may scan the n-th unit display area UDn. According to an embodiment, the first compensation-scanning stage P-C10 may include first to eighth scanning stages C1 to C8 to provide the second composition to the n-th unit display area UDn four times and to provide the third composition to the n-th unit display area UDn four times. The inkjet head IZH may be shifted such that the upper second head unit HG2 overlaps the (n−3)-th to n-th unit display areas UDn-3 to UDn. In the first compensation scanning step P-C10, the first to fourth unit areas HA' to HA4 (refer to FIG. 6B) of the upper second head unit HG2 may be disposed to overlap the n-th to (n−3)-th unit display areas UDn to UDn-3, respectively. Through sequential first to fourth scanning stages C1 to C4, the second composition is provided to the (n−3)-th to n-th unit display areas UDn-3 to UDn one time, two times, three times, and four times, respectively.

Through sequential second to fourth scanning stages C2 to C4, the third composition is provided to the (n−3)-th to (n−1)th unit display areas UDn-3 to UDn-1 one time, two times, and three times, respectively. Through sequential fifth to eighth scanning stages C5 to C8, the third composition is provided to the (n−3)-th to n-th unit display areas UDn-3 to UDn one time, two times, three times, and four times, respectively.

In an embodiment, as shown in FIG. 8C, a second compensation-scanning stage P-C20 may be performed. The first to third unit display areas UD1 to UD3 may be scanned using the upper head unit HB2 or the lower head unit HB1.

Referring to FIG. 8A, it may be seen that the first, second, and third unit display areas UD1, UD2, and UD3 are scanned by the upper head unit HB2 one time, second times, and three times, respectively, in the initial stage of scanning. In such an embodiment, the upper head unit HB2 or the lower head unit HB1 may be used, however, the first, second, and third unit display areas UD1, UD2, and UD3 may be compensation-scanned by using the upper head unit HB2 with a short turn-off period.

The third, second, and first unit areas HA3, HA2, and HA' (refer to FIG. 6B) of the upper head unit HB2 may overlap the first, second, and third unit display areas UD1, UD2, and UD3, respectively, to perform the second compensation-scanning stage P-C20.

The first, second, and third unit display areas UD1, UD2, and UD3 may be respectively scanned three times, two times, and one time through the first to third compensation-scanning stages C10 to C30 sequentially performed. During the three scanning operations, the inkjet head IZH may be shifted in the direction opposite to the second direction DR2.

In the first to third compensation-scanning stages C10 to C30, the upper first head unit HR2 and the upper second head unit HG2 may provide the first composition and the second composition to corresponding unit display areas, respectively. In an embodiment, in the first to third compensation-scanning stages C10 to C30, the upper second head unit HG2 may provide the second composition one time, two times, and three times respectively to the second pixel areas PXA-G (refer to FIG. 6E) disposed in the second, third, and fourth unit display areas UD2, UD3, and UD4.

In such an embodiment, the second composition may be provided four times, three times, two times, and one time respectively to the second pixel areas PXA-G (refer to FIG. 6E) of the first, second, third, and fourth unit display areas UD1, UD2, UD3, and UD4 through fourth to seventh scanning stages C40 to C70 of the second compensation-scanning stage P-C20. In such an embodiment, the first composition may be provided four times, three times, two times, and one time respectively to the first pixel areas PXA-R (refer to FIG. 6E) disposed in the first, second, third, and fourth unit display areas UD1, UD2, UD3, and UD4 through eighth to eleventh scanning stages C80 to C110 of the second compensation-scanning stage P-C20.

In the similar way, the second composition may be additionally provided to the second pixel areas PXA-G (refer to FIG. 6E) disposed in the fifth to eleventh unit display areas UD4 to UD11 during the second compensation-scanning stage P-C20, and the first composition may be additionally provided to the first pixel areas PXA-R (refer to FIG. 6E) disposed in the fifth to eleventh unit display areas UD4 to UD11 during the second compensation-scanning stage P-C20.

FIG. 9 is a plan view showing an inkjet process according to an embodiment of the disclosure. Hereinafter, any repetitive detailed description of the inkjet process that are the same as those described above with reference to FIG. 5 will be omitted.

Referring to FIG. 9, in a first scanning stage 1, a unit area HA' among i (i is a natural number equal to or greater than 2) unit areas HA' to HA4 may provide a liquid composition to a corresponding unit display area UD1. In an embodiment, "i" may be 4, and one unit area HA' may scan the first unit display area UD1 in the first scanning stage 1.

In a second scanning stage 2, at least some unit areas HA2 to HA4 of the other unit areas HA2 to HA4 that are not operated in the first scanning stage 1 may scan the four unit areas UD1 to UDn. In an embodiment, the second scanning stage 2 in which the entire head unit HU including the other three unit areas HA2 to HA4 performs the scanning operation is shown as a representative example.

In such an embodiment, the three unit areas HA2 to HA4 may not scan the first unit display area UD1. Accordingly, the composition in the precipitation state may be prevented from being provided two times to the first unit display area UD1.

In such an embodiment, in the second scanning stage, the unit display areas UD2 to UD4 to which the composition in the precipitation state is provided by the three unit areas HA2 to HA4 may be unit display areas different from each other. In the second scanning stage, the unit display areas to which the composition in the precipitation state is provided may be the second, third, and fourth unit display areas UD2, UD3, and UD4. Consequently, the composition in the precipitation state is provided to the first to fourth unit display areas UD1 to UD4 different from each other in the two scanning stages 1 and 2.

Then, an additional scanning operation may be performed while the head unit HU is shifted in the second direction DR2 or the direction opposite to the second direction DR2. Each of the unit display areas UD1 to UDn may be scanned i times. The head unit HU may be shifted such that each of the unit display areas is scanned one time by each of the four unit areas HA' to HA4.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device using an inkjet apparatus which provides a liquid composition comprising a scatterer, the display device comprising a display substrate comprising n unit display areas extending in a first direction and arranged in a second direction crossing the first direction, and the inkjet apparatus comprising a first head unit comprising i unit areas, each of which corresponds to one unit display area, wherein n is a natural number equal to or greater than 12, and i is a natural number equal to or greater than 2, the method comprising:

performing j scanning stages to provide a first composition to i unit display areas among the n unit display areas, wherein j is a natural number equal to or greater than 2; and performing a first compensation-scanning stage to provide the first composition to first to (i−1)-th unit display areas among the n unit display areas, wherein the i unit areas of the first head unit provide the first composition to the first unit display area to an i-th unit display area among the n unit display areas in a first scanning stage among the j scanning stages, and the first head unit is shifted in the second direction by one unit display area in every scanning stage of the j scanning stages.

2. The method of claim 1, wherein the first compensation-scanning stage comprises a plurality of compensation-scanning stages, and the compensation-scanning stages of the first compensation-scanning stage comprises a beginning compensation-scanning stage in which (i−1) unit areas among the i unit areas of the first head unit provide the first composition to the first to (i−1)-th unit display areas among the n unit display areas.

3. The method of claim 2, wherein the first head unit is shifted in a direction opposite to the second direction by the one unit display area in every compensation-scanning stage of the compensation-scanning stages.

4. The method of claim 1, wherein the unit areas, which do not overlap the first to (i−1)-th unit display areas, among the i unit areas of the first head unit do not provide the first composition in the first compensation-scanning stage.

5. The method of claim 1, further comprising:

performing a second compensation-scanning stage to provide the first composition to (n−(i−2))-th to n-th unit display areas among the n unit display areas.

6. The method of claim 5, wherein the second compensation-scanning stage is consecutively performed following a j-th scanning stage among the j scanning stages.

7. The method of claim 5, wherein
the second compensation-scanning stage comprises a plurality of compensation-scanning stages, and
the compensation-scanning stages of the second compensation-scanning stage comprises a beginning compensation-scanning stage in which i−1 unit areas among the i unit areas of the first head unit provide the first composition to the (n−(i−2))-th to n-th unit display areas among the n unit display areas.

8. The method of claim 7, wherein the first head unit is shifted in the second direction by the one unit display area in every compensation-scanning stage of the compensation-scanning stages.

9. The method of claim 1, wherein
the inkjet apparatus further comprises a second head unit comprising i unit areas, and
the second head unit provides a second composition different from the first composition to the i unit display areas.

10. The method of claim 1, further comprising:
allowing the first head unit to provide the first composition to an outside of the display substrate before the j scanning stages.

11. The method of claim 1, wherein
the inkjet apparatus further comprises a tank which stores the first composition, and
the first composition stored in the tank is circulated through an external path by a pump.

12. The method of claim 1, wherein
the inkjet apparatus further comprises a tank which stores the first composition, and
the first composition stored in the tank is circulated inside the tank by a stirrer.

13. A method of manufacturing a display device using an inkjet apparatus that provides a liquid composition comprising a resin composition and particles dispersed in the resin composition, the display device comprising a display substrate comprising n unit display areas extending in a first direction and arranged in a second direction crossing the first direction, the inkjet apparatus comprising a first head unit and a second head unit spaced apart from the first head unit in the second direction, and each of the first and second head units comprising i unit areas each of which corresponds to one unit display area, wherein n is a natural number equal to or greater than 12, and i is a natural number equal to or greater than 2, the method comprising:
performing j scanning stages to provide a first composition to i unit display areas among the n unit display areas, wherein j is a natural number equal to or greater than 2; and
performing a first compensation-scanning stage to provide the first composition to first to (i−1)-th unit display areas among the n unit display areas,
wherein the i unit areas of the first head unit provide the first composition to the first unit display area to an i-th unit display area among the n unit display areas in a first scanning stage among the j scanning stages,
the first head unit and the second head unit are shifted in the second direction by one unit display area in every scanning stage of the j scanning stages, and
the first composition is provided using the first head unit or the second head unit in the first compensation-scanning stage.

14. The method of claim 13, wherein
the inkjet apparatus further comprises a third head unit disposed between the first head unit and the second head unit, the third head unit comprises i unit areas, and
the third head unit provides a second composition different from the first composition to the i unit display areas.

15. The method of claim 13, wherein
the first head unit and the second head unit are spaced apart from each other by k unit display areas in the second direction, wherein k is a natural number equal to or greater than 2, and
the first head unit and the second head unit are shifted in the second direction by (i+k+1) unit display areas after the first head unit and the second head unit are scanned by j times.

16. The method of claim 15, wherein
j is equal to 3i, and
k is equal to 2i.

17. The method of claim 13, further comprising
performing a second compensation-scanning stage to provide the first composition to (n−(i−2))-th to n-th unit display areas among the n unit display areas,
wherein the first composition is provided using the first head unit or the second head unit in the second compensation-scanning stage.

18. The method of claim 17, wherein the first compensation-scanning stage is performed using the first or second head unit which is used in the second compensation-scanning stage.

19. The method of claim 17, wherein
the second compensation-scanning stage comprises a plurality of compensation-scanning stages, and
the compensation-scanning stages of the second compensation-scanning stage comprises a beginning compensation-scanning stage in which (i−1 unit areas among the i unit areas of the first head unit or the second head unit provide the first composition to the (n−(i−2))-th to n-th unit display areas among the n unit display areas.

20. The method of claim 19, wherein the first head unit or the second head unit is shifted in the second direction by the one unit display area in every compensation-scanning stage of the compensation-scanning stages.

* * * * *